United States Patent
Matsumura

(10) Patent No.: US 8,410,510 B2
(45) Date of Patent: Apr. 2, 2013

(54) SEMICONDUCTOR LIGHT EMITTING DEVICE AND METHOD FOR FABRICATING THE SAME

(75) Inventor: Hiroaki Matsumura, Anan (JP)

(73) Assignee: Nichia Corporation, Anan-shi (JP)

( * ) Notice: Subject to any disclaimer, the term of this patent is extended or adjusted under 35 U.S.C. 154(b) by 0 days.

(21) Appl. No.: 12/166,940

(22) Filed: Jul. 2, 2008

(65) Prior Publication Data

US 2009/0008668 A1    Jan. 8, 2009

(30) Foreign Application Priority Data

Jul. 3, 2007   (JP) ................................. 2007-175594
Jun. 24, 2008  (JP) ................................. 2008-165134

(51) Int. Cl.
*H01L 33/00* (2010.01)
(52) U.S. Cl. ...................... 257/99; 257/98; 257/E33.065
(58) Field of Classification Search .................... 257/79, 257/99
See application file for complete search history.

(56) References Cited

U.S. PATENT DOCUMENTS

| | | | | |
|---|---|---|---|---|
| 6,501,778 | B1 * | 12/2002 | Kondo et al. ............... | 372/46.01 |
| 7,049,635 | B2 * | 5/2006  | Sano et al. ................ | 257/79 |
| 8,283,687 | B2 * | 10/2012 | Lee ........................ | 257/98 |
| 2003/0141506 | A1 * | 7/2003 | Sano et al. ................ | 257/78 |
| 2005/0042788 | A1 * | 2/2005 | Ueda ....................... | 438/46 |
| 2006/0065901 | A1   | 3/2006 | Aoyagi et al. | |
| 2007/0221944 | A1 * | 9/2007 | Cheol Yoo ................. | 257/99 |
| 2008/0006836 | A1 * | 1/2008 | Lee ........................ | 257/98 |
| 2008/0048206 | A1 * | 2/2008 | Lee et al. ................. | 257/103 |
| 2008/0073659 | A1 * | 3/2008 | Tamura et al. ............. | 257/97 |
| 2008/0308829 | A1 * | 12/2008| Liu et al. ................. | 257/98 |

FOREIGN PATENT DOCUMENTS

| | | |
|---|---|---|
| JP | 5-110140 A    | 4/1993 |
| JP | 2000-36619 A  | 2/2000 |
| JP | 2003-168823 A | 6/2003 |
| JP | 2006-100500 A | 4/2006 |
| JP | 2007-81088 A  | 3/2007 |

OTHER PUBLICATIONS

Japanese Notification of Reasons for Refusal dated Aug. 21, 2012 (three (3) pages).
Japanese-language Notification of Reasons for Refusal dated Nov. 20, 2012 (Three (3) pages).

* cited by examiner

*Primary Examiner* — Robert J Hoffberg
*Assistant Examiner* — Igwe U Anya
(74) *Attorney, Agent, or Firm* — Crowell & Moring LLP

(57) ABSTRACT

A semiconductor light emitting device, which includes: a first conductivity-type semiconductor layer; a second conductivity-type semiconductor layer; a semiconductor light emitting portion having a light emitting layer which is disposed between the first conductivity-type semiconductor layer and the second conductivity-type semiconductor layer; a first conductivity-type semiconductor side electrode connected to the first conductivity-type semiconductor layer; and a second conductivity-type semiconductor side electrode connected to the second conductivity-type semiconductor layer, wherein the second conductivity-type semiconductor side electrode is disposed separated from an insulator film covering the semiconductor light emitting portion by a separation area.

17 Claims, 11 Drawing Sheets

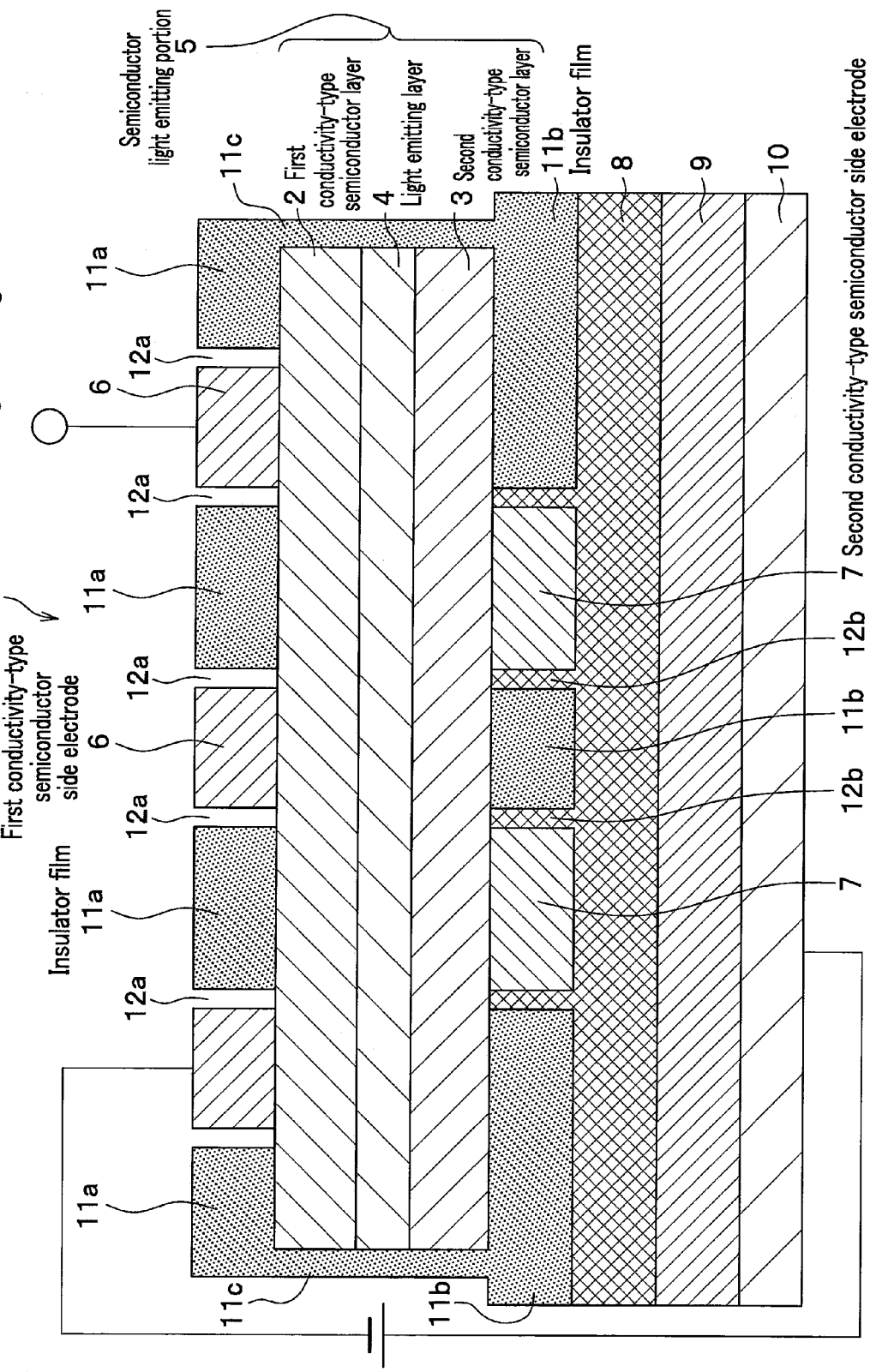

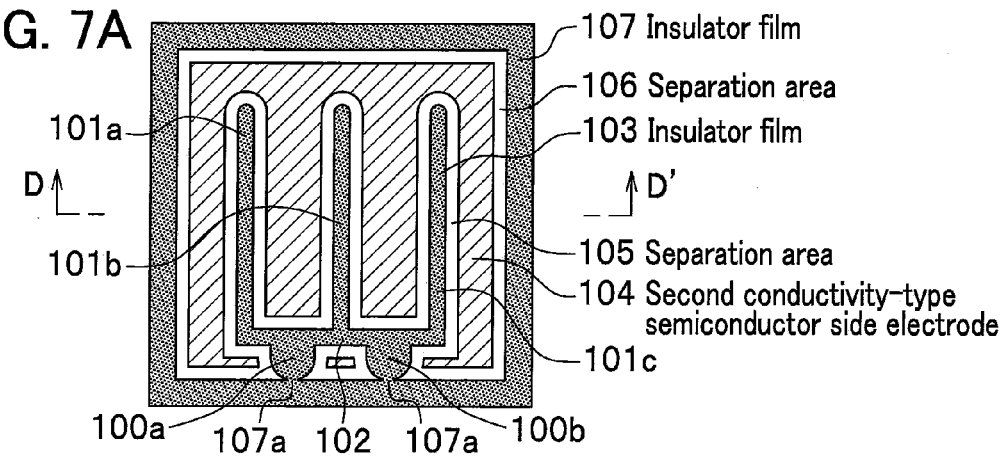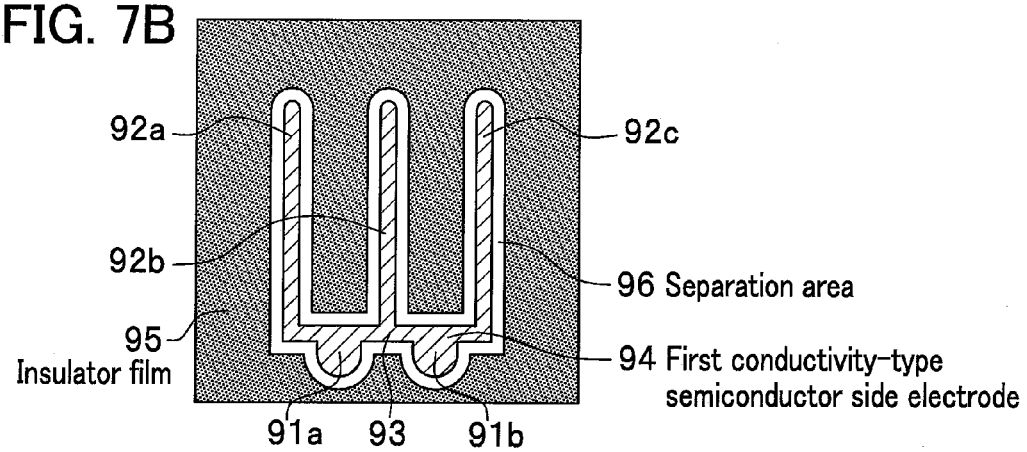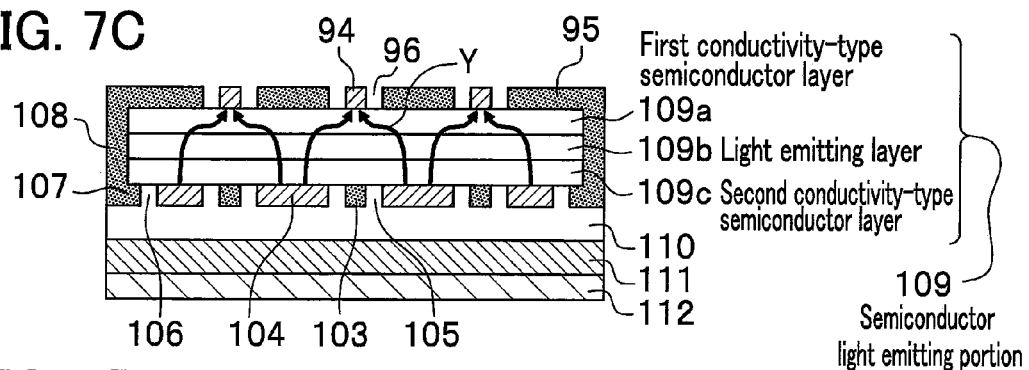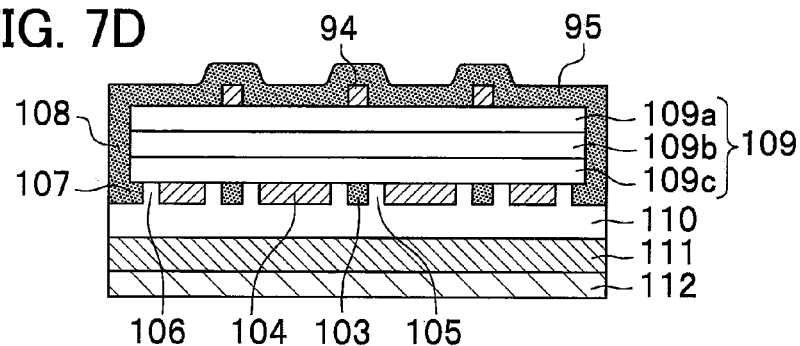

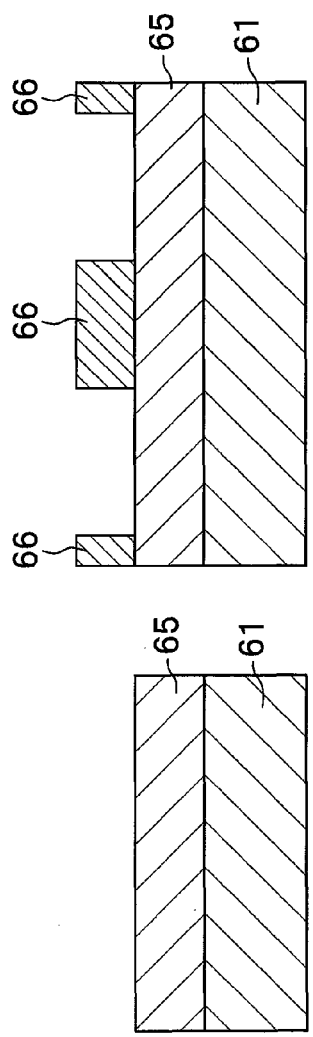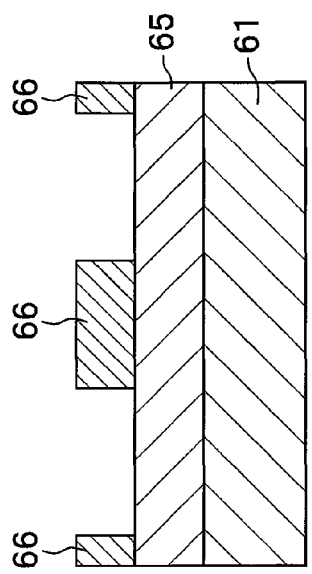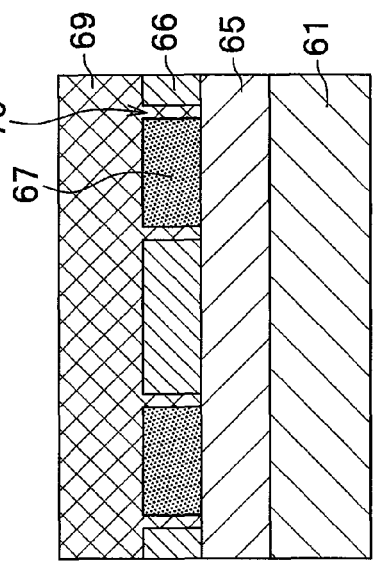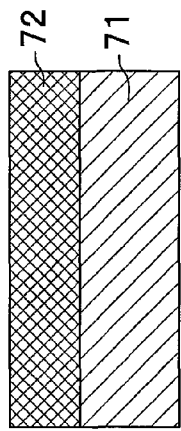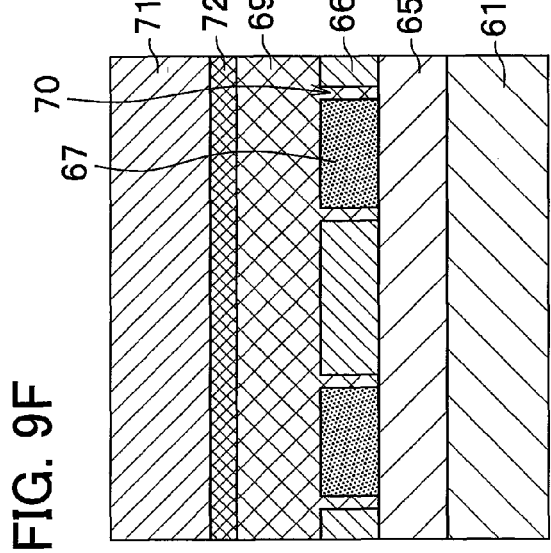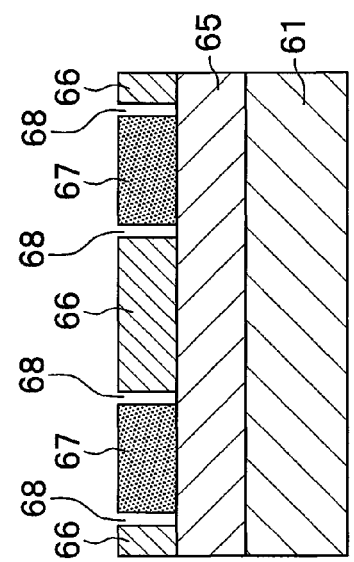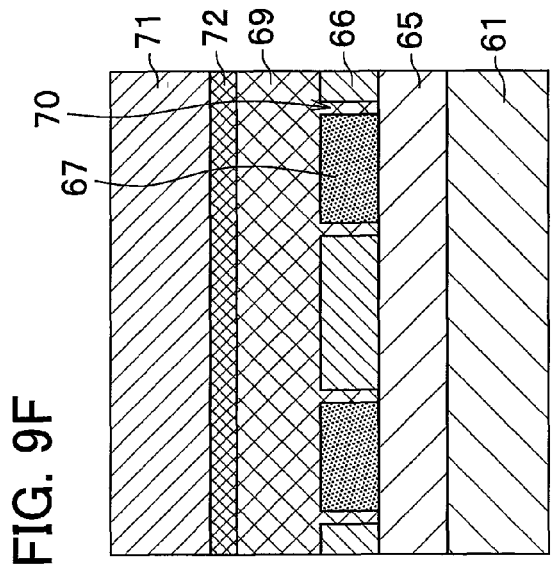
FIG. 9A  FIG. 9B  FIG. 9C  FIG. 9D  FIG. 9E  FIG. 9F

SEMICONDUCTOR LIGHT EMITTING DEVICE AND METHOD FOR FABRICATING THE SAME

CROSS REFERENCE TO RELATED APPLICATIONS

This application claims the foreign priority benefit under Title 35, United States Code, §119(a)-(d) of Japanese Patent Application No. 2007-175594, filed on Jul. 3, 2007 and Japanese Patent Application No. 2008-165134, filed on Jun. 24, 2008, the contents of which are hereby incorporated by reference.

BACKGROUND OF THE INVENTION

1. Field of the Invention

The present invention relates to a semiconductor light emitting device and a method for fabricating the semiconductor light emitting device.

2. Description of Related Art

In a light emitting device, an electrode for supplying electric current to a semiconductor layer and an insulator film for electrically insulating the electrode from its surroundings may be disposed on a semiconductor light emitting portion which has a multilayer structure composed of a plurality of semiconductor layers. In this case, the electrode is made of, for example, Ag or Al for increasing light extraction efficiency by reflecting a light emitted from the semiconductor light emitting portion. The semiconductor light emitting device may be bonded to a bonding substrate, or may be mounted on a support substrate.

On the bonding or the mounting, a heat treatment is conducted for bonding the semiconductor light emitting device to the bonding substrate, or the support substrate. In addition, when an electrode and an insulator film are formed on the semiconductor layer, the insulator film may be formed extending to cover a part of the electrode, or the electrode may be formed extending to a part of the insulator film. Especially, since Ag and Al are materials that easily migrate, the insulator film is frequently formed to cover a part of the electrode. For example, in Japanese Patent Laid-open Publication No. 2000-36619, a structure which stacks an insulating film so as to cover an electrode is disclosed. In addition, in Japanese Patent Laid-open Publication No. 2003-168823, a structure having a passivation film covering a first metal layer which contains Ag and forms an electrode on a p-type semiconductor side (hereinafter, referred to as p-type semiconductor side electrode) is disclosed. Further, in Japanese Patent Laid-open Publication No. H05-110140, a structure in which an electrode is closely contacted with outer periphery of an insulator film is disclosed.

On the bonding and the mounting of the semiconductor light emitting device, a sufficient adhesion can be obtained by conducting a heat treatment at a high temperature. However, cracks and chips which may be caused by thermal expansion are produced on an insulator film such as $SiO_2$ as the temperature becomes higher. In the structure described above, the electrode functions as a heat dissipation path during the light emitting operation of the semiconductor light emitting device. Therefore, the electrode is inevitably raised at a high temperature. If the cracks and the chips are produced, Ag or Al that forms the electrode migrates through the cracks and the chips, thereby resulting in leakages and breakdowns of the device. In addition, when a wafer is diced into semiconductor chips, the insulator film may be cracked.

It is, therefore, objects of the present invention to provide a semiconductor light emitting device and a method for fabricating the semiconductor light emitting device, which do not cause a current leakage and a breakdown of the semiconductor light emitting device through electrodes, and have excellent light extraction efficiency.

SUMMARY OF THE INVENTION

The present invention has been developed for solving the problems described above.

According to a first aspect of the present invention, there is provided a semiconductor light emitting device, which includes: a first conductivity-type semiconductor layer; a second conductivity-type semiconductor layer; a semiconductor light emitting portion having a light emitting layer which is disposed between the first conductivity-type semiconductor layer and the second conductivity-type semiconductor layer; a first conductivity-type semiconductor side electrode (hereinafter, referred to as "first conductivity-type side electrode", or simply as the "first electrode") connected to the first conductivity-type semiconductor layer; and a second conductivity-type semiconductor side electrode (hereinafter, referred to as "second conductivity-type side electrode") connected to the second conductivity-type semiconductor layer, wherein the second conductivity-type side electrode is disposed separated from an insulator film covering the semiconductor light emitting portion by a separation area.

In the semiconductor light emitting device described above, since the second conductivity-type side electrode is disposed separated from the insulator film covering the semiconductor light emitting portion by the separation area, leakages and breakdowns of the device can be prevented. In addition, since a light emitted from the semiconductor light emitting portion is effectively reflected by the electrode, a high light extraction efficiency can be achieved.

According to a second aspect of the present invention, there is provided the semiconductor light emitting device, wherein a continuous layer made of metal materials or alloy materials is disposed on outer sides of the second conductivity-type side electrode and the insulator film; and wherein the separation area is formed of a space, or a layer made of the metal materials or the alloy materials is disposed in the separation area.

In the semiconductor light emitting device described above, since the second conductivity-type side electrode is separated from the insulator film by the separation area which is formed of a space, or made of the metal materials or alloy materials, leakages and breakdowns of the device can be prevented.

According to a third aspect of the present invention, there is provided the semiconductor light emitting device, wherein a substrate is disposed on the outer sides of the second conductivity-type side electrode and the insulator film.

In the semiconductor light emitting device described above, since the substrate is disposed on the outer sides of the second conductivity-type side electrode and the insulator film, leakages and breakdowns of the device on the substrate side can be prevented.

According to a fourth aspect of the present invention, there is provided the semiconductor light emitting device, wherein the light emitting portion is disposed between the first conductivity-type semiconductor side electrode and the second conductivity-type semiconductor side electrode, and the first conductivity-type semiconductor side electrode is disposed across the first conductivity-type semiconductor layer from the light emitting layer and the second conductivity-type semiconductor side electrode is disposed across the second conductivity-type semiconductor layer from the light emitting layer, wherein the first conductivity-type semiconductor side electrode and the second conductivity-type semiconductor side electrode are alternately disposed in plane view of the semiconductor light emitting portion.

In the semiconductor light emitting device described above, since the light emitting portion is disposed between the first conductivity-type semiconductor side electrode and the second conductivity-type semiconductor side electrode, and the first conductivity-type semiconductor side electrode is disposed across the first conductivity-type semiconductor layer from the light emitting layer and the second conductivity-type semiconductor side electrode is disposed across the second conductivity-type semiconductor layer from the light emitting layer, and since the first conductivity-type semiconductor side electrode and the second conductivity-type semiconductor side electrode are alternately disposed in plane view of the semiconductor light emitting portion, a current flowing between the first conductivity-type side electrode and the second conductivity-type side electrode does not flow along a minimum path inside the semiconductor light emitting device. Therefore, a light emission in the light emitting layer of the light emitting portion becomes relatively uniform. As a result, the light extraction efficiency can be improved.

According to a fifth aspect of the present invention, there is provided the semiconductor light emitting device, wherein an area of the second conductivity-type side electrode is larger than the area of the first conductivity-type side electrode in plane view of the semiconductor light emitting portion.

In the semiconductor light emitting device described above, since the area of the second conductivity-type side electrode is formed larger than that of the first conductivity-type side electrode in plane view of the semiconductor light emitting portion, a current injection area can be made large. Therefore, the light emitting efficiency as well as a heat dissipation performance for the heat generated by the light emitting can be improved, especially in the case disposing the second conductivity-type side electrode on the mounting side.

According to a sixth aspect of the present invention, there is provided the semiconductor light emitting device, wherein the second conductivity-type side electrode is made of a light reflecting metal material.

In the semiconductor light emitting device described above, since the second conductivity-type side electrode is made of the light reflecting metal material, the light extraction efficiency can be increased.

According to a seventh aspect of the present invention, there is provided the semiconductor light emitting device, wherein the light reflecting metal material is at least one selected from a group of Ag, Al, and Rh.

In the semiconductor light emitting device described above, it is preferable that the light reflecting metal material forming the second conductivity-type side electrode is at least one selected from a group of Ag, Al, and Rh. Since the second conductivity-type side electrode made of at least one selected from the group of Ag, Al, and Rh is disposed separated from the insulator film by the separation area, leakages and breakdowns of the device due to migration of Ag, Al, or Rh can be prevented.

According to a eighth aspect of the present invention, there is provided a method for fabricating a semiconductor light emitting device, which includes steps of: forming a semiconductor light emitting portion including a first conductivity-type semiconductor layer, a second conductivity-type semiconductor layer, and a light emitting layer disposed between the first conductivity-type semiconductor layer and the second conductivity-type semiconductor layer; forming a first conductivity-type side electrode connected to the first conductivity-type semiconductor layer; forming a second conductivity-type side electrode connected to the second conductivity-type semiconductor layer; and forming the second conductivity-type side electrode to be separated from an insulator film covering the semiconductor light emitting portion by a separation area.

In the method for fabricating a semiconductor light emitting device described above, the semiconductor light emitting device which does not cause leakages and breakdowns of the device and has a high light extraction efficiency, which is achieved by effective reflection of a light emitted from the semiconductor light emitting portion by the electrodes, can be obtained, by conducting the processes for forming a semiconductor light emitting portion including a first conductivity-type semiconductor layer, a second conductivity-type semiconductor layer, and a light emitting layer disposed between the first conductivity-type semiconductor layer and the second conductivity-type semiconductor layer; forming a first conductivity-type side electrode connected to the first conductivity-type semiconductor layer; forming a second conductivity-type side electrode connected to the second conductivity-type semiconductor layer; and forming the second conductivity-type side electrode to be separated from an insulator film covering the semiconductor light emitting portion by a separation area.

In the semiconductor light emitting device described above, since the second conductivity-type side electrode is disposed separated from the insulator film by the separation area, the migration in the electrode through cracks and chips of the insulator film can be prevented, where the electrode is raised at a high temperature during the light emitting operation of the semiconductor light emitting device, and the cracks and chips are easily formed by thermal expansion of the insulator film due to heat treatment at a high temperature on the bonding and the mounting of the device. As a result, leakages and breakdowns of the semiconductor light emitting device can be prevented. Since the migration can be prevented, for example, Ag or Al that easily migrates can be used as the electrode material and a light emitted from the semiconductor light emitting portion is effectively reflected by the electrode made of Ag or Al. Accordingly, a high light extraction efficiency can be achieved.

In addition, according to the method of the present invention, a semiconductor light emitting device which does not cause leakages and breakdown of the device and has a high light extraction efficiency due to effective reflection of the light emitted from the semiconductor light emitting portion by the electrode can be obtained.

BRIEF DESCRIPTION OF THE DRAWINGS

FIG. 1 is a schematic cross sectional view showing a structure of a semiconductor light emitting device according to an embodiment of the present invention;

FIG. 4A to FIG. 4C show an arrangement example of electrodes and insulator films in a semiconductor light emitting device according to the present invention, in which FIG. 4A is a schematic plane view showing the arrangement example on a side of a second conductivity-type side electrode, FIG. 4B is a schematic plane view showing the arrangement example on a side of a first conductivity-type side electrode, and FIG. 4C is a schematic cross sectional view taken along A-A' line of FIG. 4A;

FIG. 5A and FIG. 5B show an arrangement example of electrodes and insulator films in a semiconductor light emitting device according to the present invention, in which FIG. 5A is a schematic plane view showing the arrangement example on a side of a second conductivity-type side electrode and FIG. 5B is a schematic plane view showing the arrangement example on a side of a first conductivity-type side electrode;

FIG. 6A to FIG. 6C show an arrangement example of electrodes and insulator films in a semiconductor light emitting device according to the present invention, in which FIG. 6A is a schematic plane view showing the arrangement example on a side of a second conductivity-type side electrode, FIG. 6B is a schematic plane view showing the arrangement example on a side of a first conductivity-type side electrode, and FIG. 6C is a schematic cross sectional view taken along C-C' line of FIG. 6A;

FIG. 7A to FIG. 7D show arrangement examples of electrodes and insulator films in a semiconductor light emitting device according to the present invention, in which FIG. 7A is a schematic plane view on a side of a first conductivity-type side electrode, FIG. 7B is a schematic plane view on a side of a second conductivity-type side electrode, FIG. 7C is a schematic cross sectional view taken along D-D' line of FIG. 7A, and FIG. 7D is a schematic cross sectional view showing another arrangement example;

FIG. 9A to FIG. 9F are schematic cross sectional views for sequentially explaining main processes of a method for fabricating a nitride semiconductor light emitting device;

DETAILED DESCRIPTION OF THE PREFERRED EMBODIMENT

Figure 2A:
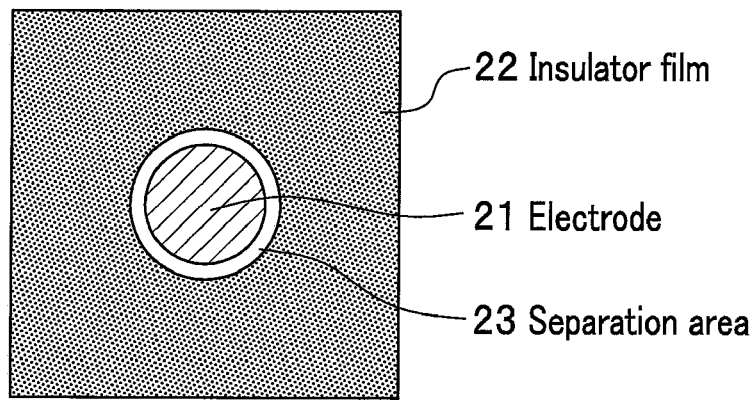
FIG. 2A and FIG. 2B are schematic plane views showing an arrangement example of electrodes and insulator films in a semiconductor light emitting device according to the present invention.

Hereinafter, a semiconductor light emitting device and a method for fabricating the semiconductor light emitting device according to the present invention will be explained in details. FIG. 1 is a schematic cross sectional view showing a structure of a semiconductor light emitting device 1 according to an embodiment of the present invention.

A semiconductor light emitting device 1 shown in FIG. 1 has a structure provided with a semiconductor light emitting portion 5 which includes a first conductivity-type semiconductor layer 2, a second conductivity-type semiconductor layer 3, and a light emitting layer 4 disposed between the first conductivity-type semiconductor layer 2 and the second conductivity-type semiconductor layer 3, and provided with a first conductivity-type side electrode 6 connected to the first conductivity-type semiconductor layer 2 and a second conductivity-type side electrode 7 connected to the second conductivity-type semiconductor layer 3. In addition, on the second conductivity-type semiconductor layer 3, an insulator film 11b is disposed separated from the second conductivity-type side electrode 7. Further, on bottom surfaces of the second conductivity-type side electrode 7 and the insulator film 11b, a continuous layer (hereinafter, referred to as "metallization layer") 8 made of metal materials or alloy materials is continuously disposed in contact with the second conductivity-type side electrode 7 and the insulator film 11b. Furthermore, on a bottom side of the metallization layer 8, a substrate 9 and a backside metallization layer 10 are disposed in this order. 11c is an insulator film and connected to the insulator 11b on the side of the semiconductor light emitting portion 5.

A n-type or p-type semiconductor layer is formed in the first conductivity-type semiconductor layer 2 and the second conductivity-type semiconductor layer 3, which constitute the semiconductor light emitting portion 5, by doping dopants in the semiconductor layers. A specific example of a semiconductor material which constitutes the first conductivity-type semiconductor layer 2 and the second conductivity-type semiconductor layer 3 is GaN, AlN, or InN, or a III-V nitride semiconductor ($In_\alpha Al_\beta Ga_{1-\alpha-\beta}N$, $0 \leq \alpha$, $0 \leq \beta$, $\alpha+\beta \leq 1$) of a mixed crystal of GaN, AlN, and InN, a mixed crystal in which, for example, B is partially or entirely used as a group III element or N is partially substituted with, for example, P, As, and Sb as a group V element, GaAs based materials such as AlGaAs and InGaAs, InP based materials such as AlGaInP, and other III-V compound semiconductors such as InGaAsP which is a mixed crystal of the GaAs based materials and the InP based materials. In addition, a dopant to be doped in the semiconductor material as a n-type dopant is, for example, Si, Ge, Sn, S, O, Ti, and Zr, which are group IV elements or group VI elements, and a dopant as a p-type dopant is, for example, Be, Zn, Mn, Cr, Mg, and Ca. If the first conductivity-type semiconductor layer 2 and the second conductivity-type semiconductor layer 3 are made of nitride semiconductor materials, Si-contained GaN and Mg-contained GaN are most preferable since contact resistances between the GaN and the first conductivity-type side electrode 6 and between the GaN and the second conductivity-type side electrode 7 can be lowered. A total film thickness of the semiconductor light emitting portion 5 including the first conductivity-type semiconductor layer 2, the second conductivity-type semiconductor layer 3, and the light emitting layer 4 is about 1000 to 5000 nm.

The first conductivity-type semiconductor layer 2 and the second conductivity-type semiconductor layer 3 may be formed of a multilayer structure, respectively. For example, the first conductivity-type semiconductor layer 2 may have a multilayer structure stacked with a contact layer and a cladding layer in this order from the first conductivity-type side electrode 6. In addition, the second conductivity-type semiconductor layer 3 may have a multilayer structure stacked with a contact layer and a cladding layer in this order from the second conductivity-type side electrode 7. In addition, if the first conductivity-type semiconductor layer 2 and the second conductivity-type semiconductor layer 3 have a multilayer structure, the multilayer structure may be constituted by alternately stacking a layer of undoped semiconductor material and a layer of doped semiconductor material.

The light emitting layer 4 emits a light produced by recombination of electrons and holes injected from the first conductivity-type semiconductor layer 2 and the second conductivity-type semiconductor layer 3, respectively. Each of the layers 2 and 3 has a different conductivity-type, n-type or p-type.

It is preferable that the light emitting layer 4 has a quantum well structure including a well layer and a barrier layer. In addition, a semiconductor material constituting the light emitting layer 4 may be a non-doped material, n-type material, and p-type material. Especially, it is preferable that the light emitting layer 4 is made of a non-doped material or n-type material. Further, for example, the well layer may be an undoped material and the barrier layer may be an n-type material. Furthermore, a wavelength of a light to be produced in the light emitting layer 4 may be controlled according to, for example, a purpose and application of the semiconductor light emitting device by changing a composition of the well layer or selecting a species and quantity of a dopant to be doped in the well layer. For example, in the light emitting layer 4 made of nitride semiconductors, a light having a wavelength of 60 to 650 nm, preferably 380 to 560 nm, may be emitted. In addition, a light having a wavelength which is not available by the conventional InGaN well layer, specifically, a light having a wavelength of about 365 nm which corresponds to a band gap energy of GaN, or a shorter wavelength than 365 nm may be obtained by including Al into the well layer.

The metallization layer 8 bonds the substrate 9 and the second conductivity-type side electrode 7 as well as the insulator film 11b, and electrically connects between the second conductivity-type side electrode 7 and backside metallization layer 10 via the substrate 9. The metallization layer 8 is formed as a continuous layer made of metal materials or alloy materials. In the present invention, the continuous layer is continuously formed at least to connect the second conductivity-type side electrode 7 and the insulator film 11b. In addition, as shown in FIG. 1, the continuous layer has an area approximately as large as that of the semiconductor light emitting portion 5, and connected to the second conductivity-type side electrode 7 and the insulator film 11b.

The metallization layer 8 and the backside metallization layer 10 constitute bonding layers for, for example, the second conductivity-type side electrode 7, the insulator film 11b, and the substrate on the bonding and the mounting. The metallization layer includes at least a low melting material such as Sn and Pb, and is formed by metal materials such as Ti, Pt, Au, Sn, Au, Ag, Cu, Bi, Pb, and Zn or by alloy materials of the above metal materials. The metallization layer 8 may be formed in a structure of, for example, Ti(100 nm)/Pt(100 nm)/Au(300 nm)/Sn(3000 nm)/Au(100 nm) in this order, and has a total thickness of 3600 nm. A thickness of the backside metallization layer 10 is about 600 nm.

Generally, silicon (Si) is used for the substrate 9. It is noted that other than Si, for example, a semiconductor substrate made of a semiconductor such as Ge, SiC, GaN, GaAs, GaP, InP, ZnSe, ZnS, and ZnO, a single metal substrate, or a metal substrate made of metal composite which is composed of not less than two metals which are immiscible each other or have a small semi-miscible limit may be used. As the single metal substrate, for example, a Cu substrate can be used. In addition, as the metal substrate, for example, a substrate which is made of at least one metal selected from highly-conducting metals such as Ag, Cu, Au, and Pt and at least one metal selected from high hardness metals such as W, Mo, Cr, and Ni may be used. If a semiconductor material substrate is used, a device, for example, a zener diode may be added to the substrate. Further, as the metal substrate, a complex of Cu-W or Cu-Mo may be used.

In the semiconductor light emitting device 1, the first conductivity-type side electrode 6 is formed on an outer side of the first conductivity-type semiconductor layer 2, the second conductivity-type side electrode 7 is formed on an outer side of the second conductivity-type semiconductor layer 3, and the first conductivity-type side electrode 6 is disposed separated from the insulator 11a by a separation area 12a of a space. In addition, the second conductivity-type side electrode 7 is disposed separated from the insulator 11b by a separation area 12b in which metal materials or alloy materials forming the metallization layer 8 are filled. In addition, the separation area 12b between the second conductivity-type side electrode 7 and the insulator film 11b may be formed of a space which is not filled with the metal materials or alloy materials forming the metallization layer 8 if a metallization layer (continuous layer made of metal materials or alloy materials) is disposed on the outer side of the second conductivity-type side electrode 7 and the insulator film 11b and if the separation area 12b is sealed with the second conductivity-type semiconductor layer 3, the second conductivity-type side electrode 7, the insulator film 11b, and the metallization layer 8. Further, if a width between the first conductivity-type side electrode 6 and the insulator 11a and a width between the second conductivity-type side electrode 7 and the insulator film 11b are too wide, the light extraction efficiency in the places where the separation areas are disposed becomes low. Therefore, the widths are set to not more than 10 μm, and more preferably, the widths are set to 1 to 10 μm to ensure a stable effect of the separation. In addition, when the first conductivity-type semiconductor layer 2 is made of an n-type semiconductor and the second conductivity-type semiconductor layer 3 is made of a p-type semiconductor, the separation area is not always necessary between (between the center insulator film and second conductivity-type side electrode in FIG. 1) the insulator 11b which is surrounded by the p side electrode (second conductivity-type side electrode 7) and the p side electrode (second conductivity-type side electrode 7), for preventing the electrode material such as Ag, which forms the p side electrode (second conductivity-type side electrode 7), from migrating to the n side electrode (first conductivity-type side electrode 6) via the insulator film 11b and insulator film 11c connecting the insulator 11b and the insulator 11a.

The second conductivity-type side electrode 7 is made of, for example, Ag, Al, Ti, Pt, or Rh. Especially, in the present invention, the electrode 7 made of at least one selected from a group of Ag, Al, and Rh (light reflecting metal material) is effective for increasing the light extraction efficiency. The second conductivity-type side electrode 7 is formed of, for example, a four-layer structure of Ag(100 nm)/Ni(100 nm)/Ti(100 nm)/Pt(100 nm) in this order from the second conductivity-type semiconductor layer 3, resulting in 400 nm in total film thickness. In this case, if an Ag layer is formed on the second conductivity-type semiconductor layer 3, a light emitted from the light emitting layer 4 can be effectively reflected.

If the first conductivity-type side electrode 6 and the second conductivity-type side electrode 7 are made of, for example, Ag or Al, the device can be prevented from causing leakages and breakdowns due to migration of Ag or Al by separating the second conductivity-type side electrode 7 from the insulator film 11b and the first conductivity-type side electrode 6 from the insulator film 11a by the separation areas 12a, 12b, respectively. Especially, if the second conductivity-type side electrode 7 is made of Ag having a high reflectivity, the device can be prevented from causing leakages and breakdowns due to migration of Ag.

In addition, the first conductivity-type side electrode 6 and the second conductivity-type side electrode 7 are disposed not to overlap each other in plane view of the semiconductor light emitting portion 5 with the semiconductor light emitting portion 5 between the first conductivity-type side electrode 6 and the second conductivity-type side electrode 7. That is, the first conductivity-type side electrode 6 and the second conductivity-type side electrode 7 are alternately arranged in plane view of the semiconductor light emitting portion 5. As described above, since the first conductivity-type side electrode 6 and the second conductivity-type side electrode 7 are arranged alternately, a current flowing between the first conductivity-type side electrode 6 and the second conductivity-type side electrode 7 does not take a minimum path within the semiconductor light emitting portion 5. Therefore, a light emitting in the light emitting layer 4 becomes relatively uniform, resulting in a preferable result of the light extraction efficiency. Further, in the first conductivity-type side electrode 6 and the second conductivity-type side electrode 7, an area of the second conductivity-type side electrode 7 is formed larger than that of the first conductivity-type side electrode 6 in plane view of the semiconductor light emitting portion 5. Therefore, a current injection area can be formed larger, resulting in improvements of the light emitting efficiency and a heat dissipation performance for the heat generated by the light emitting. Accordingly, a heat dissipation performance of the semiconductor light emitting device 1 can be improved.

Further, the insulator films 11a, 11b, 11c are made of insulating materials such as $SiO_2$, SiN, $Al_2O_3$, ZnO, $ZrO_2$, $TiO_2$, $Nb_2O_5$, and $Ta_2O_5$. The insulator films 11a, 11b may be formed of a multilayer film stacked with not less than two layers, and a layer thickness of each layer constituting the multilayer film may be designed so that a light emitted from the semiconductor light emitting portion 5 is also reflected in the insulator film 11b.

It is preferable that the insulator film 11b is formed in a thickness, for example, substantially identical to that of the second conductivity-type side electrode 7. Especially, it is preferable that the insulator film 11b is formed in a thickness identical to that of the second conductivity-type side electrode 7 since a formation of voids between the insulator film 11b and the metallization layer 8 and between the second conductivity-type side electrode 7 and the metallization layer 8 can be prevented when bonded to the bonding substrate 9 through the metallization layer 8.

In the semiconductor light emitting device 1, the second conductivity-type side electrode 7 is disposed separated from the insulator film 11b by the separation area 12b. With the configuration described above, the migration in the electrode through cracks and chips of the insulator film can be prevented, in which the electrode is raised at a high temperature during the light emitting operation of the semiconductor light emitting device, and the cracks and chips are easily formed by thermal expansion of the insulator film due to heat treatment at a high temperature on the bonding and the mounting of the device. Therefore, leakages and breakdowns of the semiconductor light emitting device 1 can be prevented. As described above, since the migration issue can be avoided, Ag or Al that easily migrates may be used as an electrode material. Therefore, since a light emitted from the semiconductor light emitting portion 5 is effectively reflected by the electrode made of Ag or Al, a high extraction efficiency can be achieved. Especially, when the second conductivity-type semiconductor layer 3 is a p-type semiconductor, the separation area 12b is effective for preventing the semiconductor light emitting device 1 from causing leakages and breakdowns due to migration of the electrode material, for example, Ag forming the second conductivity-type side electrode 7 on the p-type side, to the first conductivity-type side electrode 6 via the insulator film 11b. In addition, the separation area 12b is effective for obtaining the semiconductor light emitting device 1 which can be prevented from causing leakages and breakdowns of the device 1 by disposing such a separation structure on the side of the second conductivity-type side electrode 7 having a larger surface area, and has an excellent light extraction efficiency by preferably reflecting a light by the second conductivity-type side electrode 7. In addition, since the area of the second conductivity-type side electrode 7 is large, a current injection area can be made larger. Accordingly, the light emitting efficiency can be improved, as well as the thermal dissipation performance for the heat generated by the light emitting can be improved.

Next, an embodiment of arrangement of an electrode (first conductivity-type side electrode 6, second conductivity-type side electrode 7) 21 and an insulator film 22 (11a, 11b) in the semiconductor light emitting device 1 will be explained.

Figure 2B:
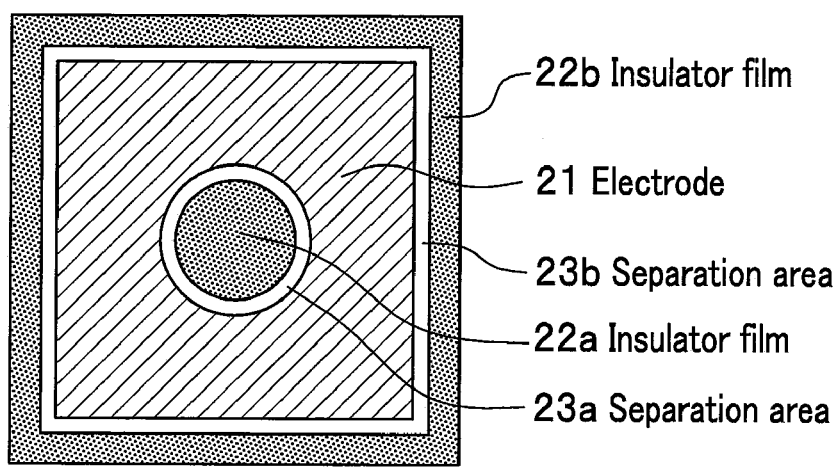

FIG. 2A and FIG. 2B are schematic plane views showing an arrangement example of the electrode 21 and the insulator film 22. FIG. 3A to FIG. 3D are schematic cross sectional views showing arrangement examples of the electrode 21 and the insulator film 22.

In the arrangement example shown in FIG. 2A, the electrode 21 and the insulator film 22 are disposed so that the insulator film 22 surrounds the electrode 21, and that the electrode 21 is disposed separated from the insulator film 22 by a separation area 23.

In addition, in the arrangement example shown in FIG. 2B, the electrode 21 surrounds an insulator 22a through a separation area 23a, and furthermore, an insulator film 22b surrounds the outer side of the electrode 21 through a separation area 23b. In the arrangement example described above, the insulator film 22a is disposed separated from the electrode 21 by the separation area 23a, and the electrode 21 is disposed separated from the insulator 22b by the separation area 23b.

Figure 3A:
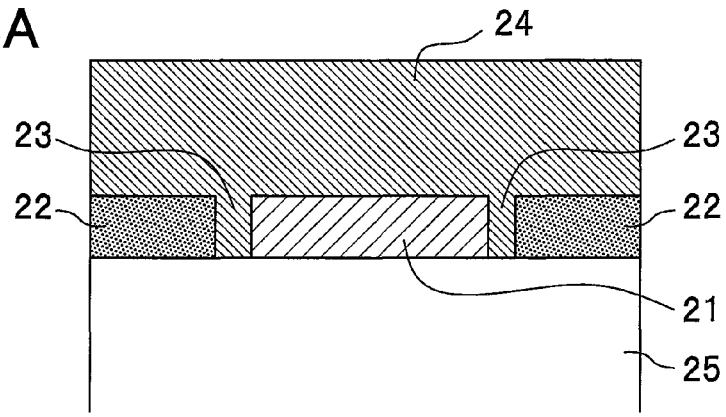
FIG. 3A to FIG. 3D are schematic cross sectional views showing arrangement examples of electrodes and insulator films in each semiconductor light emitting device according to the present invention.

In the arrangement example shown in FIG. 3A, on a semiconductor light emitting portion 25, the electrode 21 is disposed separated from the insulator film 22 by the separation area 23, and in the separation area 23, materials forming a metallization layer 24 which is formed on the electrode 21 and the insulator film 22 are filled.

Figure 3B:
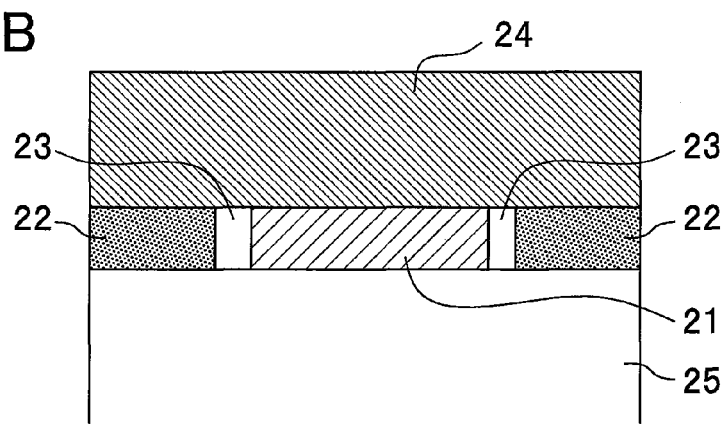

In the arrangement example shown in FIG. 3B, on the semiconductor light emitting portion 25, the electrode 21 is disposed separated from the insulator film 22 by the separation area 23, and in the separation area 23, materials forming the metallization layer 24 which is formed on the electrode 21 and the insulator film 22 are not filled, resulting in forming a space.

Figure 3C:
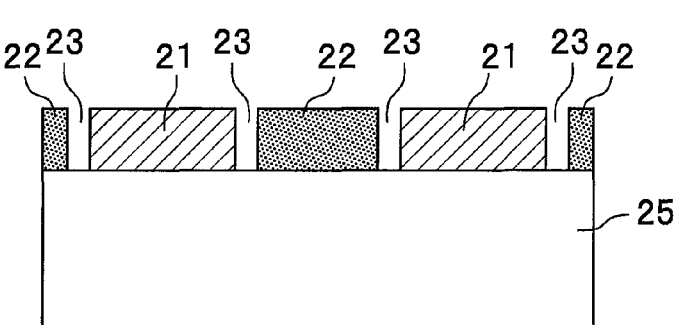
Figure 3D:
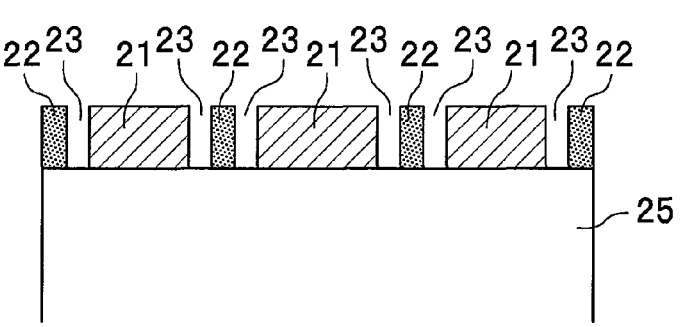

In the arrangement examples shown in FIG. 3C and FIG. 3D, on the semiconductor light emitting portion 25, the electrode 21 and the insulator film 22 are alternately disposed, and the separation area 23 of a space is disposed between the electrode 21 and the insulator film 22.

FIG. 4A to FIG. 6B are schematic views showing three embodiments of arrangement examples of electrodes (first conductivity-type side electrode, second conductivity-type side electrode) and insulator films in the light emitting device 1.

Figure 4A:
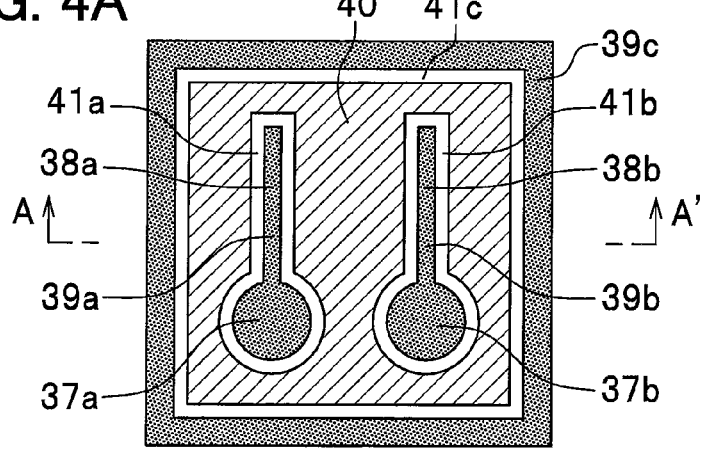

FIG. 4A is a schematic plane view showing a surface of the second conductivity-type semiconductor layer in plane view, to which the second conductivity-type side electrode is connected, as seen from the side (from above paper of FIG. 4A) of the first conductivity-type side electrode of the semiconductor light emitting device 1.

The arrangement example shown in FIG. 4A includes insulator films 39a, 39b which are composed of circular head portions 37a, 37b and rectangular portions 38a, 38b extending from the circular head portions 37a, 37b, and the second conductivity-type side electrode 40 surrounding the insulator films 39a, 39b, in addition to an insulator film 39c surrounding the second conductivity-type side electrodes 40. The circular head portions 37a, 37b and the rectangular portions 38a, 38b of the two insulator films 39a, 39b are disposed in parallel with each other. Further, the insulator films 39a, 39b are disposed separated from the second conductivity-type side electrode 40 by separation areas 41a, 41b and the second conductivity-type side electrode 40 is disposed separated from an insulator film 39c by a separation area 41c. Furthermore, the outer periphery insulator film 39c is connected to an insulator film 36 which is located on the side of the first conductivity-type side electrodes 34a, 34b via an insulator film 42 which is disposed on an outer side edge of the semiconductor light emitting device 1.

Figure 4B:
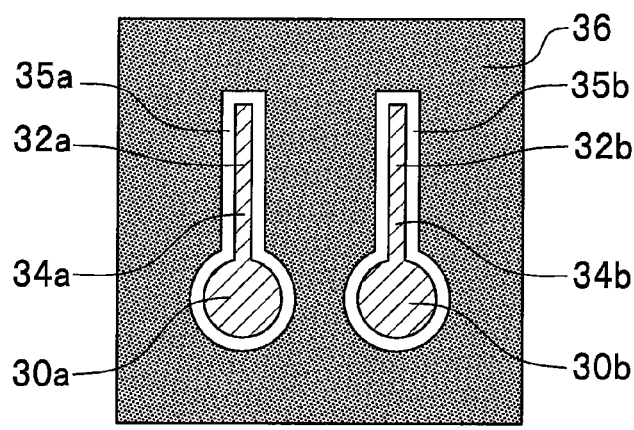

FIG. 4B is a schematic plane view showing a surface of the first conductivity-type semiconductor layer in plane view, to which the first conductivity-type side electrode is connected, as seen from the side of the first conductivity-type side electrode of the semiconductor light emitting device 1.

On the side of the first conductivity-type side electrode shown in FIG. 4B, positions of the electrode and insulator are replaced each other in contrast to the positions of the second conductivity-type side electrode 40 and insulator films 39a, 39b shown in FIG. 4A. That is, the arrangement example shown in FIG. 4B includes the first conductivity-type side electrode 34a, 34b composed of circular head portions 30a, 30b and rectangular portions 32a, 32b extending from the circular head portions 30a, 30b, and the insulator film 36 which surrounds the first conductivity-type side electrodes 34a, 34b through separation areas 35a, 35b disposed around the first conductivity-type side electrodes 34a, 34b. The circular head portions 30a, 30b are pad electrodes for electrically connecting the semiconductor light emitting device to the outside. The rectangular portions 32a, 32b are extended electrodes for expanding a current on a surface of a first conductivity-type side electrode 43a (see FIG. 4C) so that the current flows in entire semiconductor light emitting portion 43 (see FIG. 4C). A combination of the pad electrodes (circular head portions 30a, 30b) and the extended electrodes (rectangular portions 32a, 32b) is called as the first conductivity-type side electrodes 34a, 34b. However, at least the pad electrodes (circular head-portions 30a, 30b) may be enough for the first conductivity-type side electrode, and the extended electrodes (rectangular portions 32a, 32b) are not always necessary. The circular head portions 30a, 30b and the rectangular portions 32a, 32b of the two first conductivity-type side electrodes 34a, 34b are disposed in parallel with each other on the same side.

Figure 4C:
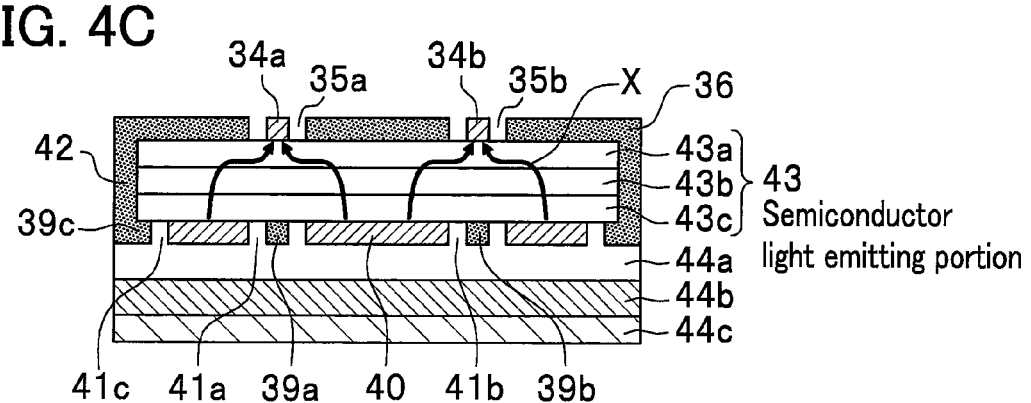

Next, FIG. 4C is a schematic cross sectional view taken along A-A' line of FIG. 4A.

As shown in FIG. 4C, the first conductivity-type side electrodes 34a, 34b and the second conductivity-type side electrode 40 are alternately disposed in plane view (as seen from above paper of FIG. 4A) of the semiconductor light emitting device with the semiconductor light emitting portion 43 between the first conductivity-type side electrodes 34a, 34b and the second conductivity-type side electrode 40. The semiconductor light emitting portion 43 is composed of a first conductivity-type semiconductor layer 43a, a light emitting layer 43b, and a second conductivity-type semiconductor layer 43c, which are disposed in this order from the first conductivity-type side electrodes 34a, 34b. In addition, on outer sides of the second conductivity-type side electrode 40 and the insulator films 39a, 39b, 39c, a metallization layer 44a made of metal materials or alloy materials is continuously disposed in contact with the second conductivity-type side electrode 40 and the insulator films 39a, 39b, 39c. Further, on an outer side of the metallization layer 44a, a substrate 44b is disposed and on an outer side of the substrate 44b, a backside metallization layer 44c is disposed. Furthermore, separation areas 41a, 41b between the second conductivity-type side electrode 40 and the insulator films 39a, 39b and a separation area 41c between the second conductivity-type side electrode 40 and the insulator film 39c are filled with the metal materials or alloy materials which form the metallization layer 44a. It is noted that if the separation areas 41a, 41b are sealed with the second conductivity-type semiconductor layer 43c, the second conductivity-type side electrode 40, the insulator films 39a, 39b and the substrate 44b, the separation areas 41a, 41b may be formed of spaces.

Figure 5A:
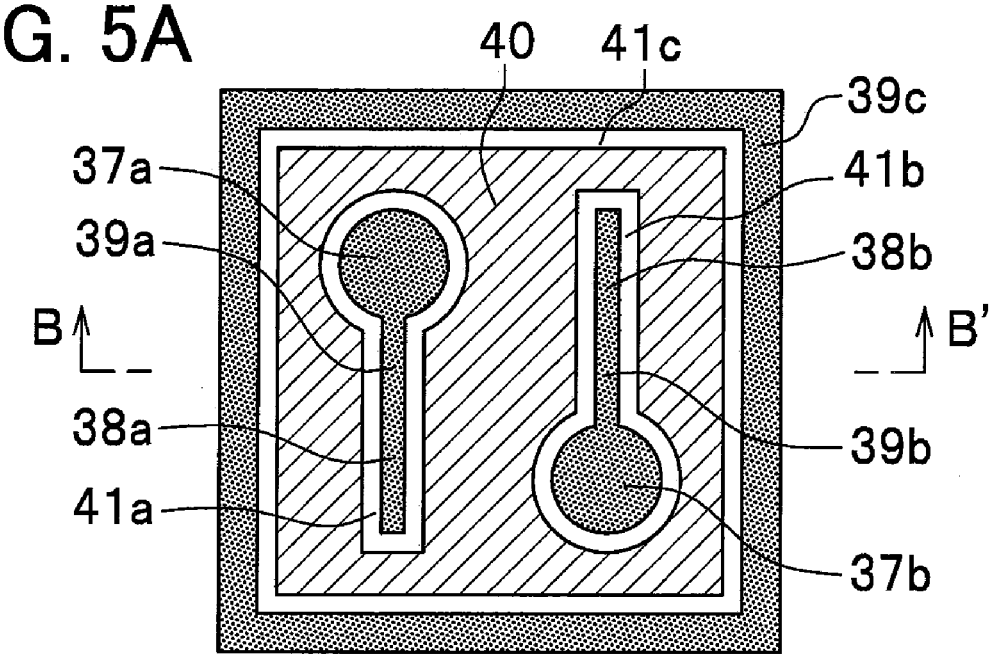
Figure 5B:
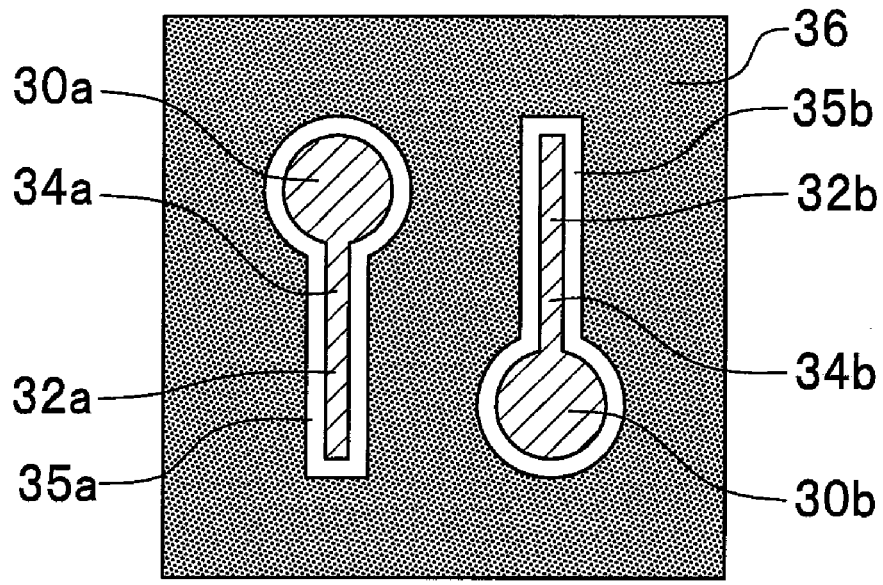

FIG. 5A and FIG. 5B show another arrangement example of electrodes and insulator films in the semiconductor light emitting device.

FIG. 5A is a schematic plane view showing a surface of the second conductivity-type semiconductor layer in plane view, to which the second conductivity-type side electrode is connected, as seen from a side of the first conductivity-type side electrode of the semiconductor light emitting device.

In the arrangement example shown in FIG. 5A, the insulator films 39a, 39b composed of the circular head portions 37a, 37b and the rectangular portions 38a, 38b extending from the circular head portions 37a, 37b are disposed so that the circular head portions 37a, 37b and the rectangular portions 38a, 38b are arranged in antiparallel with each other, and the second conductivity-type side electrode 40 is disposed surrounding the insulator films 39a, 39b, and further, the insulator film 39c is disposed surrounding the second conductivity-type side electrode 40. The insulator films 39a, 39b are disposed separated from the second conductivity-type side electrode 40 by the separation areas 41a, 41b surrounding perimeters of the insulator films 39a, 39b, and the second conductivity-type side electrode 40 is disposed separated from the insulator film 39c by the separation area 41c. The insulator film 39c surrounds the second conductivity-type side electrode 40 and is disposed in the outer periphery of the semiconductor light emitting device. In addition, the outer periphery insulator film 39c is connected to the insulator film 36 on the side of the first conductivity-type side electrodes 34a, 34b through the insulator film disposed on the outer side edge of the semiconductor light emitting device.

FIG. 5B is a schematic plane view showing a surface of the first conductivity-type semiconductor layer in plane view, to which the first conductivity-type side electrode is connected, as seen from a side of the first conductivity-type side electrode of the semiconductor light emitting device.

On the side of the first conductivity-type side electrode, positions of the electrode and insulator are replaced each other in contrast to the positions of the second conductivity-type side electrode 40 and insulators 39a, 39b shown in FIG. 5A. The arrangement example shown in FIG. 5B includes the first conductivity-type side electrodes 34a, 34b composed of the circular head portions 30a, 30b and the rectangular portions 32a, 32b extending from the circular head portions 30a, 30b, and the insulator film 36 which surrounds the first conductivity-type side electrodes 34a, 34b and is disposed separated from the first conductivity-type side electrodes 34a, 34b by the separation areas 35a, 35b surrounding the first conductivity-type side electrodes 34a, 34b. The circular head portions 30a, 30b are pad electrodes for electrically connecting the semiconductor light emitting device to the outside. The rectangular portions 32a, 32b are extended electrodes for expanding a current on a surface of a first conductivity-type semiconductor layer 43a (see FIG. 4C) so that the current flows in entire semiconductor light emitting portion 43 (see FIG. 4C). A combination of the pad electrodes (circular head portions 30a, 30b) and the extended electrodes (rectangular portions 32a, 32b) is called as the first conductivity-type side electrodes 34a, 34b. However, at least the pad electrodes (circular head portions 30a, 30b) may be enough for the first conductivity-type side electrode, and the extended electrodes (rectangular portions 32a, 32b) are not always necessary. The circular head portions 30a, 30b and the rectangular portions 32a, 32b of the two first conductivity-type side electrodes 34a, 34b are disposed in antiparallel with each other on the opposite side.

Since a cross sectional structure taken along B-B' line of FIG. 5A in the arrangement example shown in FIG. 5A and FIG. 5B is identical to that shown in FIG. 4C, the explanation will be omitted.

Figure 6A:
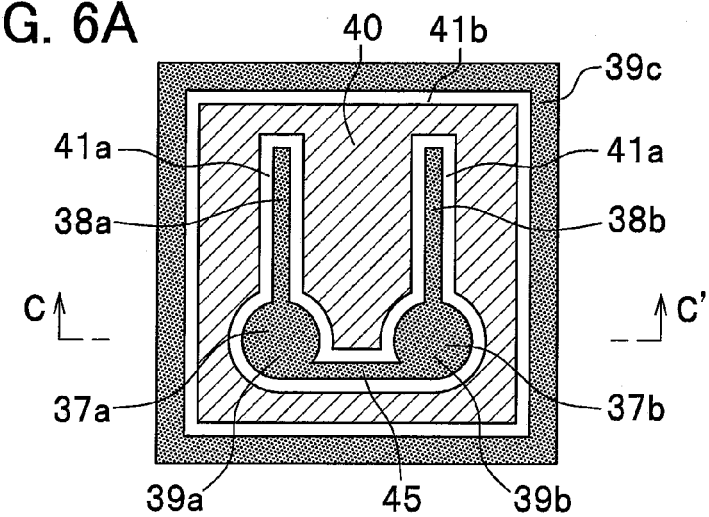
Figure 6B:
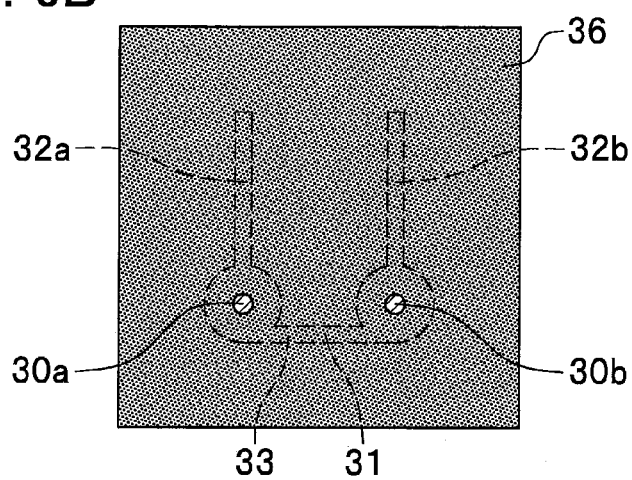

FIG. 6A and FIG. 6B show another arrangement example of electrodes and insulator films in the semiconductor light emitting device.

FIG. 6A is a schematic plane view showing a surface of the second conductivity-type semiconductor layer in plane view, to which the second conductivity-type side electrode is connected, as seen from above the first conductivity-type side electrode.

The arrangement example shown in FIG. 6A includes the insulator films 39a, 39b composed of the circular head portions 37a, 37b and the rectangular portions 38a, 38b extending from the circular head portions 37a, 37b, the second conductivity-type side electrode 40 surrounding the insulator films 39a, 39b, and the insulator film 39c surrounding the second conductivity-type side electrode 40. The circular head portions 37a, 37b and the rectangular portions 38a, 38b of the two insulator films 39a, 39b are arranged in parallel each other on the same side, and the circular head portion 37a of the insulator film 39a and the circular head portion 37b of the insulator film 39b are connected through a connection portion 45. In addition, the insulator films 39a, 39b are disposed separated from the second conductivity-type side electrode 40 by the separation area 41a, and the second conductivity-type side electrode 40 is disposed separated from the insulator film 39c by the separation area 41b. The outer periphery insulator film 39c is connected to the insulator film 36 on the side of a first conductivity-type side electrode 33 by the insulator film disposed on the outer side edge of the semiconductor light emitting device.

FIG. 6B is a schematic plane view showing a surface of the first conductivity-type semiconductor layer in plane view, to which the first conductivity-type side electrode is connected, as seen from the side of the first conductivity-type side electrode of the semiconductor light emitting device.

In the arrangement example on the side of the first conductivity-type side electrode shown in FIG. 6B, positions of the electrode and insulator are replaced in contrast to the positions of the second conductivity-type side electrode 40 and insulator films 39a, 39b shown in FIG. 6A. That is, the arrangement example shown in FIG. 6B includes the first conductivity-type side electrode 33 composed of the circular head portions 30a, 30b, the rectangular portions 32a, 32b extending from the circular head portions 30a, 30b, and a connection portion 31 connecting the two circular head portions 37a and 37b. In addition, as shown in FIG. 6B, on the surface of the first conductivity-type side electrode 33, the insulator film 36 surrounds the first conductivity-type side electrode 33, and the first conductivity-type side electrode 33 is disposed in contact with the insulator film 36 without disposing a separation area. Especially, center areas of the circular head portions 30a, 30b of the pad electrodes are exposed, and other areas other than the center areas are covered with the insulator film 36. Therefore, adhesiveness of the first conductivity-type side electrode 33 is increased and the first conductivity-type side electrode 33 is prevented from peeling off.

Figure 6C:
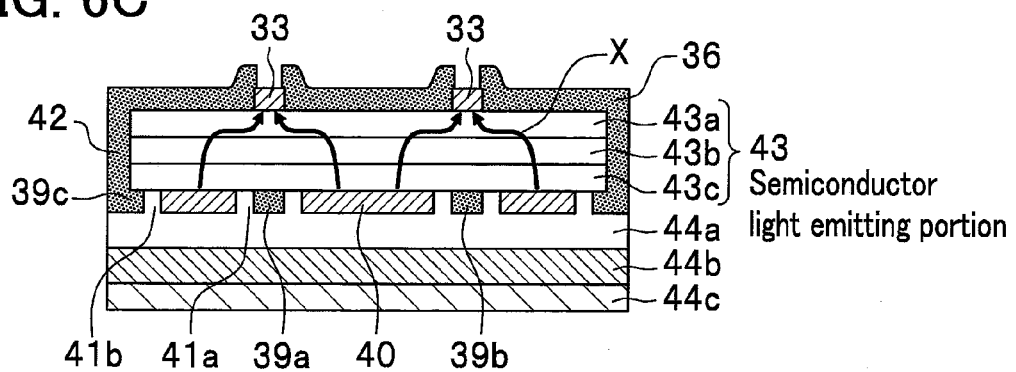

FIG. 6C is a schematic cross sectional view taken along C-C' line of FIG. 6A.

As shown in FIG. 6C, the first conductivity-type side electrode 33 and the second conductivity-type side electrode 40 are alternately disposed in plane view of the semiconductor light emitting device with the semiconductor light emitting portion 43 between the first conductivity-type side electrode 33 and the second conductivity-type side electrode 40. The semiconductor light emitting portion 43 is composed of the first conductivity-type semiconductor layer 43a, the light emitting layer 43b, and the second conductivity-type semiconductor layer 43c, which are disposed in this order from the first conductivity-type side electrode 33. The first conductivity-type side electrode 33 is disposed in contact with the insulator film 36. The center areas of the circular head portions 30a, 30b of first conductivity-type side electrode 33 are exposed and other areas (upper peripheries of circular head portions 30a, 30b, rectangular portions 32a, 32b) other than the center areas are covered with the insulator film 36. In addition, on outer sides of the second conductivity-type side electrode 40 and the insulator films 39a, 39b, 39c, a metallization layer 44a made of metal materials or alloy materials is continuously disposed in contact with the second conductivity-type side electrode 40 and the insulator films 39a, 39b, 39c, and on the outer side of the metallization layer 44a, a substrate 44b is disposed, further, on the outer side of the substrate 44b, a backside metallization layer 44c is disposed. The separation area 41a between the second conductivity-type side electrode 40 and the insulator films 39a, 39b and the separation area 41b between the second conductivity-type side electrode 40 and the insulator film 39c are filled with the metal materials or alloy materials forming the metallization layer 44. It is noted that if the separation areas 41a, 41b are sealed with the second conductivity-type semiconductor layer 43c, the second conductivity-type side electrode 40, the insulator films 39a, 39b and the substrate 44b, the separation areas 41a, 41b may be formed of spaces.

The arrangement examples of electrodes and insulator films shown in FIG. 4A to FIG. 5B are examples in which the separation areas 35a, 35b are disposed between the first conductivity-type side electrodes 34a, 34b and the insulator film 36. However, in the semiconductor light emitting device according to the present invention, for example, as shown in FIG. 6A to FIG. 6C, if the separation areas 41a, 41b are disposed between the second conductivity-type side electrode 40 and the insulator films 39a, 39b, 39c, a separation area is unnecessary between the first conductivity-type side electrode 33 and the insulator film 36.

In the semiconductor light emitting device having the arrangements of electrodes and insulator films shown in FIG. 4A to FIG. 6C, the migration through cracks and chips of the insulator film, which are easily formed by thermal expansion due to heat treatment at a high temperature on the bonding and the mounting, can be prevented by disposing the separation areas 41a, 41b, 41c between the second conductivity-type side electrode 40 located on the side of the substrate or the mounting side and the insulator films 39a, 39b, 39c. Therefore, since the electrode (second conductivity-type side electrode 40) can be made of, for example, Ag or Al that easily migrates, and thereby a light emitted from the semiconductor light emitting portion 43 can be effectively reflected by the electrode made of Ag or Al, a high light extraction efficiency can be achieved. Especially, if the second conductivity-type semiconductor layer 43*c* of the semiconductor light emitting portion 43 on the side of the second conductivity-type side electrode 40 is made of a p-type semiconductor, and if Ag or Al that easily migrates is used as the electrode material forming the second conductivity-type side electrode 40 on the p-type side, the separation areas 41*a*, 41*b*, 41*c* are effective for preventing the device from causing leakages and breakdowns by the migration of Ag or Al to the first conductivity-type side electrodes 34*a*, 34*b*, 33 through the insulator films 39*a*, 39*b*, 39*c*.

Since the insulator films 39*a*, 39*b* on the side of the second conductivity-type side electrode 40 and the outer periphery insulator film 39*c* are disposed independently as shown in FIG. 4B, FIG. 5B, or FIG. 6B, as well as the first conductivity-type side electrodes 34*a*, 34*b*, 33 and the second conductivity-type side electrode 40 are alternately disposed in plane view (as seen from above paper of FIG. 4A, FIG. 5A, or FIG. 6A) of the semiconductor light emitting device, an area of the second conductivity-type side electrode 40 can be formed large. Therefore, a current injection area can be formed larger. As a result, the light emitting efficiency as well as the heat dissipation performance for the heat of the light emitting can be increased, thereby resulting in improvement of the heat dissipation performance of the semiconductor light emitting device.

In addition, since the first conductivity-type side electrodes 34*a*, 34*b*, 33 and the second conductivity-type side electrode 40 are alternately disposed in plane view (as seen from above paper of FIG. 4A, FIG. 5A, or FIG. 6A) of the semiconductor light emitting device, as shown in FIG. 4C and FIG. 6C, a current flowing between the first conductivity-type side electrodes 34*a*, 34*b*, 33 and the second conductivity-type side electrode 40 flows through a path indicated by arrow X (see FIG. 4C) inside the semiconductor light emitting portion 43 located between the first conductivity-type side electrodes 34*a*, 34*b* and the second conductivity-type side electrode 40 which are alternately disposed, thereby, the current flowing in the semiconductor light emitting portion 43 can be controlled. Specifically, the current tends not to flow toward a portion of the semiconductor light emitting portions 43*b*, 43*c* facing the first conductivity-type side electrodes 34*a*, 34*b*, 33, thereby resulting in relatively poor light emission in the portion. On the contrary, the current tends to flow toward a portion of the semiconductor light emitting portion 43 facing the second conductivity-type side electrodes 40, thereby resulting in relatively strong light emission in the portion. As a result, a light can be effectively extracted from a side of the first conductivity-type semiconductor layer 43*a*. In addition, as shown in FIG. 4B, FIG. 5B, and FIG. 6B, in the embodiment where the first conductivity-type side electrodes 34*a*, 34*b*, 33 are separated from the insulator film 36 by the separation areas 35*a*, 35*b*, a control of the current becomes effective. As a result, the light extraction from the side of the first conductivity-type semiconductor layer 43*a* becomes further effective.

Next, other embodiments of arrangements of electrodes (first conductivity-type side electrode 6 and second conductivity-type side electrode 7 shown in FIG. 1) and insulator films (11*a*, 11*b* shown in FIG. 1) in the semiconductor light emitting device 1 will be explained by referring to FIG. 7A to FIG. 7D.

FIG. 7A is a schematic plane view showing a surface of the second conductivity-type semiconductor layer in plane view, to which the second conductivity-type side electrode is connected from a side of the first conductivity-type side electrode.

The arrangement example on the side of the second conductivity-type side electrode includes an insulator film 103 composed of half circular head portions 100*a*, 100*b* having a half disk shape, branch portions 101*a*, 101*b*, 101*c* having a long branch shape, and a connection portion 102 connecting the half circular head portions 100*a*, 100*b* and the branch portions 101*a*, 101*b*, 101*c*, and a second conductivity-type side electrode 104 surrounding the insulator film 103. The insulator film 103 is separated from the second conductivity-type side electrode 104 by a separation area 105 surrounding the insulator film 103, and the second conductivity-type side electrode 104 is separated from an outer periphery insulator film 107 by a separation area 106 surrounding the second conductivity-type side electrode 104. In addition, the half circular head portions 100*a*, 100*b* of the insulator film 103 are connected to the outer periphery insulator film 107 through connection portions 107*a*. That is, the inner side insulator film 103 and the outer periphery insulator film 107 are continuously disposed. Further, as shown in FIG. 7C, the outer periphery insulator film 107 is connected to an insulator film 95 on the side of a first conductivity-type side electrode 94 by an insulator film 108 disposed on the outer side edge of the semiconductor light emitting device 1.

FIG. 7B is a schematic plane view showing a surface of the first conductivity-type semiconductor layer in plane view, to which the first conductivity-type side electrode is connected, as seen from a side of the first conductivity-type side electrode.

In the arrangement example shown in FIG. 7B, positions of electrodes and insulator films are replaced each other in contrast to the positions of the second conductivity-type side electrode 104 and insulator film 103 shown in FIG. 7A. That is, the arrangement example includes the first conductivity-type side electrode 94 composed of half circular head portions 91*a*, 91*b* having a half disk shape, branch portions 92*a*, 92*b*, 92*c* having a long branch shape, and a connection portion 93 connecting the half circular head portions 91*a*, 91*b* and the branch portions 92*a*, 92*b*, 92*c*, and the insulator film 95 surrounding the first conductivity-type side electrode 94. The insulator film 95 is separated from the first conductivity-type side electrode 94 by a separation area 96. The half circular head portions 91*a*, 91*b* are pad electrodes for electrically connecting the semiconductor light emitting device to the outside. The branch portions 92*a*, 92*b*, 92*c* are extended electrodes for expanding a current on a surface of a first conductivity-type semiconductor layer 109*a* (see FIG. 7C) so that the current flows in entire semiconductor light emitting portion 109 (see FIG. 7C). A combination of the pad electrodes (half circular head portions 91*a*, 91*b*) and the extended electrodes (branch portions 92*a*, 92*b*) is called as the first conductivity-type side electrode 94. However, at least the pad electrodes (half circular head portions 91*a*, 91*b*) may be enough for the first conductivity-type side electrode, and the extended electrodes (branch portions 92*a*, 92*b*) are not always necessary.

Next, FIG. 7C is a schematic cross sectional view taken along D-D' line of FIG. 7A.

As shown in FIG. 7C, the first conductivity-type side electrode 94 and the second conductivity-type side electrode 104 are alternately disposed in plane view (as seen from above paper of FIG. 7A) of the semiconductor light emitting device with a semiconductor light emitting portion 109 between the first conductivity-type side electrode 94 and the second conductivity-type side electrode 104. The semiconductor light emitting portion 109 is formed by stacking a first conductivity-type semiconductor layer 109*a*, a light emitting layer 109*b*, and a second conductivity-type semiconductor layer 109*c* in this order from the side of the first conductivity-type side electrode 94. In addition, on outer sides of the second conductivity-type side electrode 104 and the insulator film 103, a metallization layer 110 made of metal materials or alloy materials is continuously disposed in contact with the second conductivity-type side electrode 104 and the insulator film 103. On the outer side of the metallization layer 110, a substrate 111 is disposed and on the outer side of the substrate 111, a backside metallization layer 112 is further disposed. In addition, the metal materials or the alloy materials forming the metallization layer 110 are filled in a separation area 105 between the second conductivity-type side electrode 104 and the insulator film 103 and in a separation area 106 between the second conductivity-type side electrode 104 and the outer periphery insulator film 107.

An arrangement example of electrodes and insulators shown in FIG. 7A to FIG. 7C is the example which disposes a separation area 96 between the first conductivity-type side electrode 94 and the insulator film 95. However, in a semiconductor light emitting device according to the present invention, if the separation areas 105, 106 are disposed between the second conductivity-type side electrode 104 and the insulator films 103, 107, a separation area between the first conductivity-type side electrode 94 and the insulator film 95 is unnecessary as shown in FIG. 7D.

FIG. 7D is a schematic cross sectional view for explaining an arrangement example where a separation area is not disposed between the first conductivity-type side electrode 94 and the insulator film 95.

In the arrangement example shown in FIG. 7D, arrangements and compositions of, for example, the first conductivity-type side electrode 94, the insulator film 95, the insulator film 103, the second conductivity-type side electrode 104, the separation area 105, the separation area 106, the insulator film 107, the insulator film 108, the metallization layer 110, the substrate 111, and the backside metallization layer 112 are identical to those of the arrangement example shown in FIG. 7A to FIG. 7C, except that there is no separation area between the first conductivity-type side electrode 94 and the insulator film 95, or that the first conductivity-type side electrode 94 is disposed in contact with the insulator film 95. That is, as shown in FIG. 7D, the insulator film 95 directly surrounds the first conductivity-type side electrode 94 without disposing a separation area, and is connected to the insulator film 107 on the side of the second conductivity-type side electrode 104 through the insulator film 108 which is disposed on the outer side edge of the semiconductor light emitting device. In addition, the first conductivity-type side electrode 94 and the second conductivity-type side electrode 104 are alternately disposed in plane view of the semiconductor light emitting device with the semiconductor light emitting portion 109 between the first conductivity-type side electrode 94 and the second conductivity-type side electrode 104. Further, on the side of the second conductivity-type side electrode 104, the second conductivity-type side electrode 104 is separated from the insulator film 103 by the separation area 105 surrounding the insulator film 103, and also, the second conductivity-type side electrode 104 is separated from the outer periphery insulator film 107 by the separation area 106 surrounding the second conductivity-type side electrode 104. In addition, the metal materials or the alloy materials forming the metallization layer 110 are filled in the separation area 105 between the second conductivity-type side electrode 104 and the insulator film 103 and in the separation area 106 between the second conductivity-type side electrode 104 and the outer periphery insulator film 107. As shown in FIG. 7D, when the first conductivity-type side electrode 94 is disposed in contact with the insulator film 95, the insulator film 95 is disposed on the first conductivity-type side electrode 94 so that the insulator film 95 covers a part of the first conductivity-type side electrode 94, and that a part of each pad electrode (half circular head portions 91*a*, 91*b* in FIG. 7B) is exposed similar to FIG. 6B. Therefore, the adhesiveness of the first conductivity-type side electrode 94 increases, thereby the first conductivity-type side electrode 94 can be prevented from peeling off.

It is noted that in the arrangement examples shown in FIG. 7A to FIG. 7C and in FIG. 7D, if the separation area 105 is sealed with the second conductivity-type semiconductor layer 109*c*, the second conductivity-type side electrode 104, the insulator film 103, and the substrate 111, the separation area 105 may be formed of a space.

In a semiconductor light emitting device having the arrangements of electrodes and insulator films shown in FIG. 7A to FIG. 7C and in FIG. 7D, the migration through cracks and chips of the insulator film, which are easily formed by thermal expansion due to heat treatment at a high temperature on the bonding and the mounting, can be prevented by disposing the separation areas 106, 105. Therefore, an electrode (second conductivity-type side electrode 104) can be formed on the side of the substrate or the mounting side with, for example, Ag or Al that easily migrates, thereby the light emitted from the semiconductor light emitting portion 109 is effectively reflected by the electrode made of Ag or Al. As a result, a high light extraction efficiency can be achieved. Especially, if the second conductivity-type semiconductor layer 109*c* of the semiconductor light emitting portion 109 on the side of the second conductivity-type side electrode 104 is made of a p-type semiconductor, and if, for example, Ag or Al that easily migrates is used as the electrode material for forming the second conductivity-type side electrode 104 on the p-type side, the separation areas 106, 105 are effective for preventing the semiconductor light emitting device from causing leakages and breakdowns due to migration of Ag or Al to the first conductivity-type side electrode 94 through the insulator films 107, 108, 95.

In addition, the half circular head portions 91*a*, 91*b* to be the pad electrodes of the first conductivity-type side electrode 94 can be formed in the vicinity of the outer periphery of the semiconductor light emitting device in plane view of the device as seen from the side of the second conductivity-type side electrode 104, by continuously forming the inner side insulator film 103 on the side of the second conductivity-type side electrode 104 and the outer periphery insulator film 107 as shown in FIG. 7B, as well as alternately disposing the first conductivity-type side electrode 94 and the second conductivity-type side electrode 104 in plane view (as seen from above paper of FIG. 7A) of the semiconductor light emitting device. Therefore, the semiconductor light emitting device can be mounted with a relatively simple wiring. For example, a line such as a wire can be easily connected to the pad electrode with a short wire from the outer periphery side of the semiconductor light emitting device without crossing, for example, another electrode portion. In addition, since the half circular head portions 91*a*, 91*b* to be the pad electrodes of the first conductivity-type side electrode 94 can be formed in the vicinity of the outer periphery of the semiconductor light emitting device, a shadowing of a light by the wire between the outer periphery of the semiconductor light emitting device and the pad electrode can be minimized.

Further, since the first conductivity-type side electrode 94 and the second conductivity-type side electrode 104 are alternately disposed in plane view (as seen from above paper of FIG. 7A) of the semiconductor light emitting device, the insulator films 103, 107 on the side of the second conductivity-type side electrode 104 reflect a light propagating inside the semiconductor light emitting portion 109, thereby the light extraction efficiency can be improved. Especially, since the metallization layer 110 is disposed on the outer side of the insulator films 103, 107 on the side of the second conductivity-type side electrode 104, a total reflection angle between the second conductivity-type semiconductor layer 109c (for example, nitride semiconductor layer) of the semiconductor light emitting portion 109 and the insulator films 103, 107 becomes large, and as a result, the light extraction efficiency is further increased.

Further, the first conductivity-type side electrode 94 and the second conductivity-type side electrode 104 are alternately disposed in plane view (as seen from above paper of FIG. 7A) of the semiconductor light emitting device, and the area of the second conductivity-type side electrode 104 is formed larger than that of the first conductivity-type side electrode 94. With the above configuration, as shown in FIG. 7C, a current flowing between the first conductivity-type side electrode 94 and the second conductivity-type side electrode 104 flows through a path indicated by arrow Y inside the semiconductor light emitting portion 109 located between the first conductivity-type side electrode 94 and the second conductivity-type side electrode 104 which are alternately disposed, thereby, the current flowing in the semiconductor light emitting portion 109 can be controlled. Specifically, the current tends not to flow toward a portion of the semiconductor light emitting portions 109b, 109c facing the first conductivity-type side electrode 94, resulting in relatively poor light emission in the portion. On the contrary, the current tends to flow toward a portion of the semiconductor light emitting portion 109 facing the second conductivity-type side electrode 104, resulting in relatively strong light emission in the portion. As a result, the light can be effectively extracted from the side of the first conductivity-type semiconductor layer 109a. In addition, as shown in FIG. 7B, in the embodiment where the first conductivity-type side electrode 94 is separated from the insulator film 95 by the separation area 96, a control of the current becomes effective. As a result, the light extraction from the side of the first conductivity-type semiconductor layer 109a becomes further effective.

Figure 8:
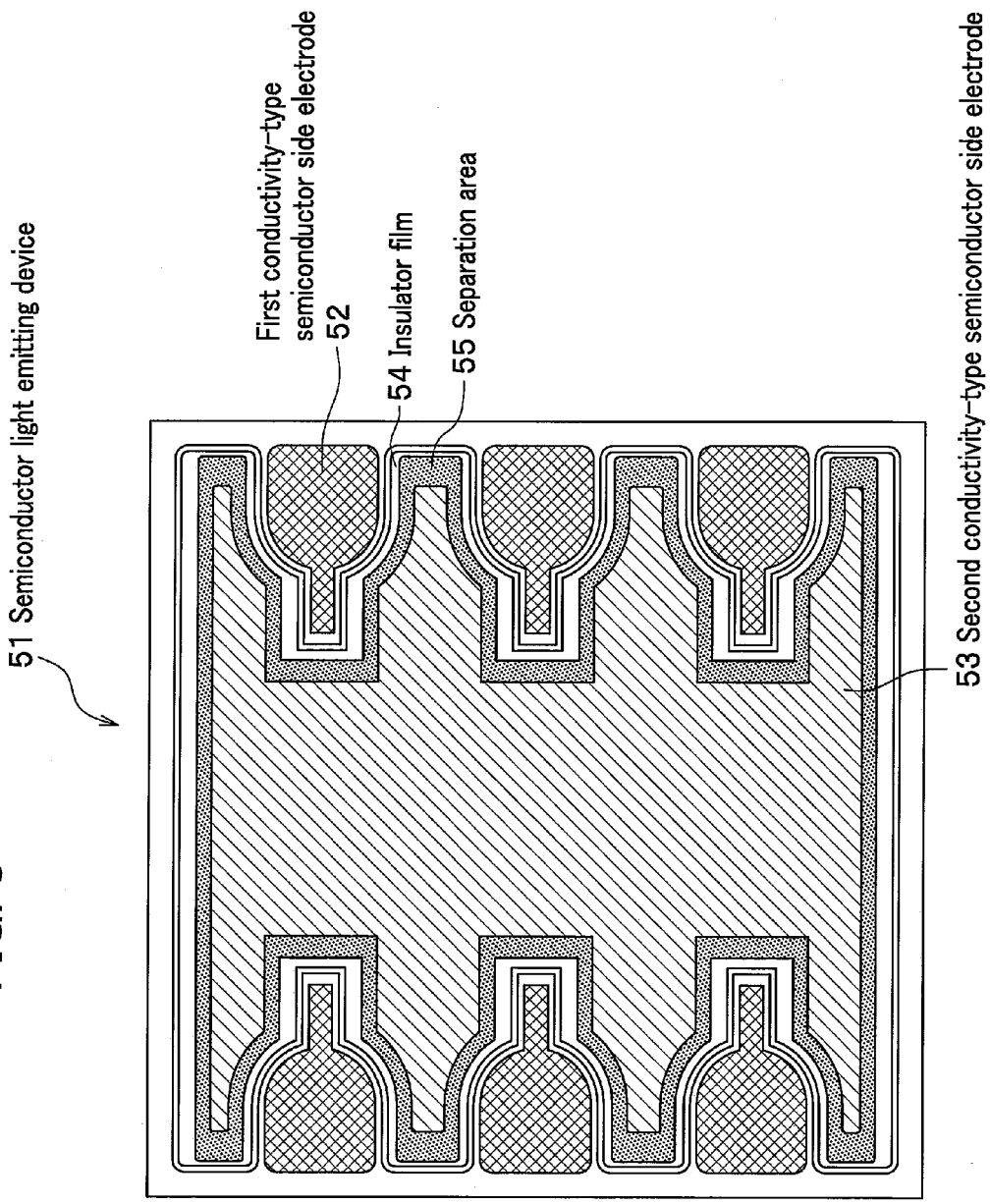
FIG. 8 is a schematic plane view showing another specific arrangement example of electrodes and insulator films in a semiconductor light emitting device according to the present invention.

FIG. 8 is a schematic plane view showing another specific arrangement example of electrodes and insulator films in a semiconductor light emitting device according to the present invention.

The semiconductor light emitting device 51 includes a second conductivity-type side electrode 53 which has a large area occupying a center portion of a square plane surface, six first conductivity-type side electrodes 52 disposed on the right and left sides of the square plane surface and facing each other across the second conductivity-type side electrode 53, and an insulator film 54 disposed between the first conductivity-type side electrodes 52 and the second conductivity-type side electrode 53.

In the semiconductor light emitting device 51, the second conductivity-type side electrode 53 is disposed separated from the insulator film 54 by a separation area 55 of a space.

In the semiconductor light emitting device 51, when the semiconductor light emitting device 51 is mounted by disposing the electrode on the mounting surface side (facedown mounting), a device structure may be fabricated by forming a metallization layer on the second conductivity-type side electrode 53, the insulator film 54, and the first conductivity-type side electrodes 52 and bonding the semiconductor light emitting device 51 to a bonding substrate through the metallization layer. In this case, since the second conductivity-type side electrode 53 is disposed separated from the insulator film 54 by the separation area 55 of a space, migration of Ag or Al, which forms the second conductivity-type side electrode 53, caused by a heat treatment, for example, on the bonding can be prevented, thereby current leakages and breakdowns of the insulator film 54 can be prevented. In addition, since a light emitted from the semiconductor light emitting portion is effectively reflected by the electrode, a high light extraction efficiency can be achieved. The area of the second conductivity-type side electrode 53 is formed larger than that of the first conductivity-type side electrode 52. Therefore, a current injection area can be formed larger, thereby resulting in increase in the light emitting efficiency, as well as increase in the heat dissipation performance for the heat generated by the light emitting. Accordingly, the heat dissipation performance of the semiconductor light emitting device 1 can be improved. In the facedown mounting, by bonding the semiconductor light emitting device 51 to a bonding substrate, a metallization layer is arranged on the first conductivity-type side electrodes 52, the insulator film 54, and the second conductivity-type side electrode 53 by the metallization layer of a continuous layer made of the metal materials or alloy materials. As a result, the separation area 55 forms a sealed space among the insulator film 54, the second conductivity-type side electrode 53, and the metallization layer.

As described above, a couple of embodiments have been explained by referring to FIG. 1 to FIG. 8. It will be obvious to those skilled in the art that various changes may be made without departing from the scope of the invention.

Next, a method for fabricating a semiconductor light emitting device according to the present invention (hereinafter, referred to as "method of the present invention") will be explained.

A semiconductor light emitting device according to the present invention can be fabricated by a method including the following main processes (1) to (4).

(1) Process 1 for forming a semiconductor light emitting portion which has a first conductivity-type semiconductor layer, a second conductivity-type semiconductor layer, and a light emitting layer disposed between the first conductivity-type semiconductor layer and the second conductivity-type semiconductor layer.

(2) Process 2 for forming a first conductivity-type side electrode connected to the first conductivity-type semiconductor layer.

(3) Process 3 for forming a second conductivity-type side electrode connected to the second conductivity-type semiconductor layer.

(4) Process 4 for forming an insulator film which is separated from at least one of the first conductivity-type side electrode and the second conductivity-type side electrode by a separation area and covers the semiconductor light emitting portion.

A method for fabricating the semiconductor light emitting device according to the present invention is not limited to the method described above, and other processes may be included as appropriate. For example, other than these processes (1) to (4), a process such as a substrate cleaning process and a heat treatment process may be added as an intermediate process or a post-process of the processes (1) to (4). In addition, in the method according to the present invention, an order for conducting the processes (2), (3), and (4) is not limited in the processes (1) to (4), and the order is determined as appropriate according to a structure of the semiconductor light emitting device to be fabricated and a mounting type of the device.

FIG. 9A to FIG. 9F and FIG. 10A to FIG. 10D are schematic cross sectional views for explaining the main processes (1) to (4) of a method for fabricating a nitride semiconductor light emitting device as the method for fabricating a semiconductor light emitting device according to the present invention.

The process 1 for forming the semiconductor light emitting portion which has the first conductivity-type semiconductor layer, the second conductivity-type semiconductor layer, and the light emitting layer disposed between the first conductivity-type semiconductor layer and the second conductivity-type semiconductor layer can be conducted by sequentially forming the first conductivity-type semiconductor layer, the light emitting layer, and the second conductivity-type semiconductor layer on a sapphire substrate 61 as shown in FIG. 9A to form a semiconductor light emitting portion 65. A formation of the semiconductor light emitting portion 65 can be conducted with vapor phase epitaxy by supplying a gas containing, for example, a predetermined semiconductor material and dopant on an upper surface of the cleaned sapphire substrate 61 using a vapor phase epitaxy apparatus such as MOVPE(metal organic vapor phase epitaxy), HVPE (hydride vapor phase epitaxy), MBE (molecular beam epitaxy), and MOMBE (metal organic molecular beam epitaxy). In this case, for example, a semiconductor material, a species of dopant, and a composition in a supply gas are changed depending on a conductivity-type of the semiconductor layer to be formed, e.g. n-type semiconductor or p-type semiconductor, and depending on, for example, each layer composition, a material of each layer, a thickness of each layer, and etc. of a light emitting layer, when the supply gas is supplied onto the sapphire substrate 61 using an inert gas such as nitrogen as a carrier gas to form the semiconductor layers.

Next, the process 3 for forming a second conductivity-type side electrode 66 connected to the second conductivity-type semiconductor layer of the semiconductor light emitting portion 65 and a process 4-1 for forming an insulator film 67 which is separated from the second conductivity-type side electrode by a separation area and covers the semiconductor light emitting portion 65 are conducted. In the process 3 and the process 4-1, as shown in FIG. 9B, a mask corresponding to the second conductivity-type side electrode 66 is formed on an upper surface of the second conductivity-type semiconductor layer of the semiconductor light emitting portion 65 by using a resist, and then, an electrode material containing, for example, Ag is stacked thereon using, for example, sputtering to form the second conductivity-type side electrode 66. After that, another mask is formed so that the mask covers the second conductivity-type side electrode 66 by using a resist, and an insulator film material such as SiO$_2$ is stacked thereon, and then, the resist is removed. Through the above processes, as shown in FIG. 9C, a structure having a space 68 between the second conductivity-type side electrode 66 and the insulator film 67 is formed.

The process 3 and the process 4-1 can also be conducted by the following procedures. An insulator film material such as SiO$_2$ is stacked on an entire upper surface of the semiconductor light emitting portion 65. A mask corresponding to the insulator film 67 is formed on the insulator film material. A region corresponding to the second conductivity-type side electrode 66 is wet-etched. Then, an electrode material is stacked on the wet-etched region using, for example, sputtering to form the second conductivity-type side electrode 66.

Next, as shown in FIG. 9D, a metallization layer 69 is formed on the insulator film 67 and the second conductivity-type side electrode 66. Through this process, a space 68 between the insulator film 67 and the second conductivity-type side electrode 66 is filled with a metallization material to form a separation area 70 which separates the insulator film 67 from the second conductivity-type side electrode 66.

At the same time, as shown in FIG. 9E, a Si substrate 71 is prepared, and a metallization layer 72 is formed on the Si substrate 71.

Next, as shown in FIG. 9F, the metallization layer 69 formed on the insulator film 67 and the second conductivity-type side electrode 66 and the metallization layer 72 formed on the Si substrate 71 are joined together and bonded by heating.

Figure 10A:
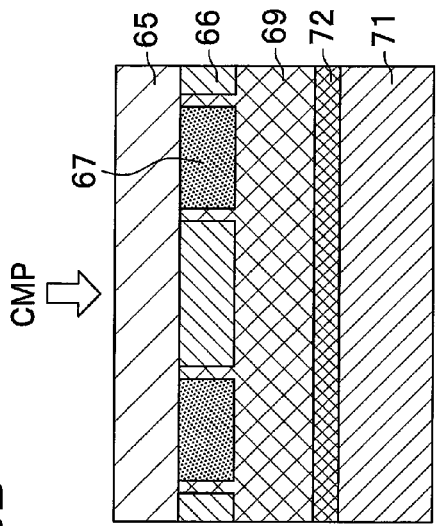
FIG. 10A to FIG. 10D are schematic cross sectional views for sequentially explaining main processes of a method for fabricating a nitride semiconductor light emitting device.
Figure 10B:
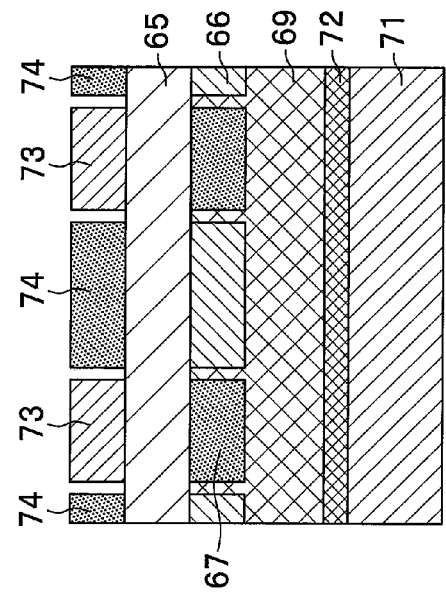
Figure 10C:
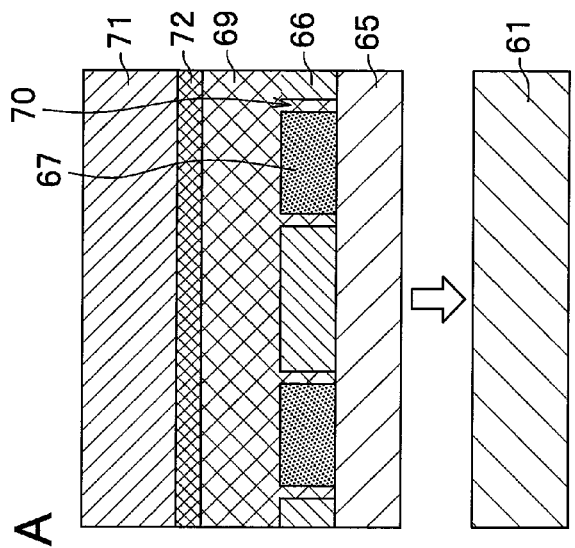
Figure 10D:
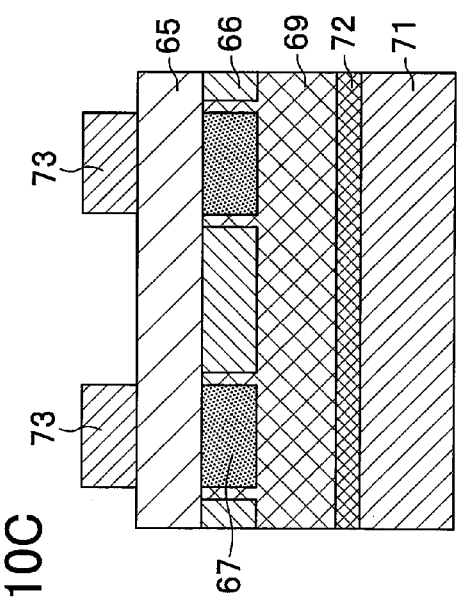

Next, as shown in FIG. 10A, after removing the sapphire substrate 61 by, for example, laser irradiation or grinding from a side of the sapphire substrate 61, the exposed semiconductor light emitting portion 65 is chemical-mechanical polished (CMP) as shown in FIG. 10B. In addition, on the chemical-mechanical polished surface, a mask for forming a first conductivity-type side electrode 73 is formed on a region facing the insulator film 67 across the semiconductor light emitting portion 65 so that the first conductivity-type side electrode 73 is not overlapped with the second conductivity-type side electrode 66 in plan view of the semiconductor light emitting portion 65. Then, an electrode material is stacked thereon by, for example, sputtering to form the first conductivity-type side electrode 73 on the semiconductor light emitting portion 65 as shown in FIG. 10C (Process 2). Here, a mask region, that is, the region where the first conductivity-type side electrode 73 is not formed is bored by reactive-ion etching (RIE) to form an area where the first conductivity-type side electrode 73 is not formed. The light extraction efficiency of the device is improved by disposing the area of no first conductivity-type side electrode 73. Especially, a light which is reflected by the second conductivity-type side electrode 66 is effectively extracted from the area. In addition, as shown in FIG. 10D, an insulator film is formed on the surface of the exposed semiconductor light emitting portion 65, where the first conductivity-type side electrode 73 is not formed. Accordingly, a semiconductor light emitting device according to the present invention can be obtained.

EXAMPLE

Hereinafter, the present invention will be explained using an example according to the present invention. However, the present invention is not limited to the example described later.

Example

A semiconductor light emitting device having a structure shown in FIG. 1 was fabricated with the following specifications.

Semiconductor Light Emitting Portion 5:
 First conductivity-type semiconductor layer 2: stack structure of GaN layer and GaN layer containing Si as n-type dopant
 Light emitting layer 4: multi quantum well structure where InGaN layer (2 nm) and GaN layer (4 nm) are alternately stacked 20 times, respectively.
 Second conductivity-type semiconductor layer 3: stack structure of GaN layer containing Mg as p-type dopant and AlGaN layer containing Mg as p-type dopant n electrode(first conductivity-type side electrode 6): Ti(20 nm)/Pt(200 nm)/Au(1000 nm)
p electrode(second conductivity-type side electrode 7): Ag(100 nm)/Ni(100 nm)/Ti(100 nm)/Pt(100 nm)
Insulator film 11b: $SiO_2$(400 nm)
Distance between p electrode(second conductivity-type side electrode 7) and insulator film 11b: 5 μm
Bonding substrate 9: Si substrate
Metallization layer 8 (stacked from p side electrode): Ti(100 nm)/Pt(100 nm)/Au(300 nm)/Sn(3000 nm)/Au(100 nm)/Pd(300 nm)/Pt(100 nm)/$TiSi_2$(10 nm)
Backside metallization layer 10: $TiSi_2$(10 nm)/Pt(100 nm)/Pd(300 nm)

Figure 11:
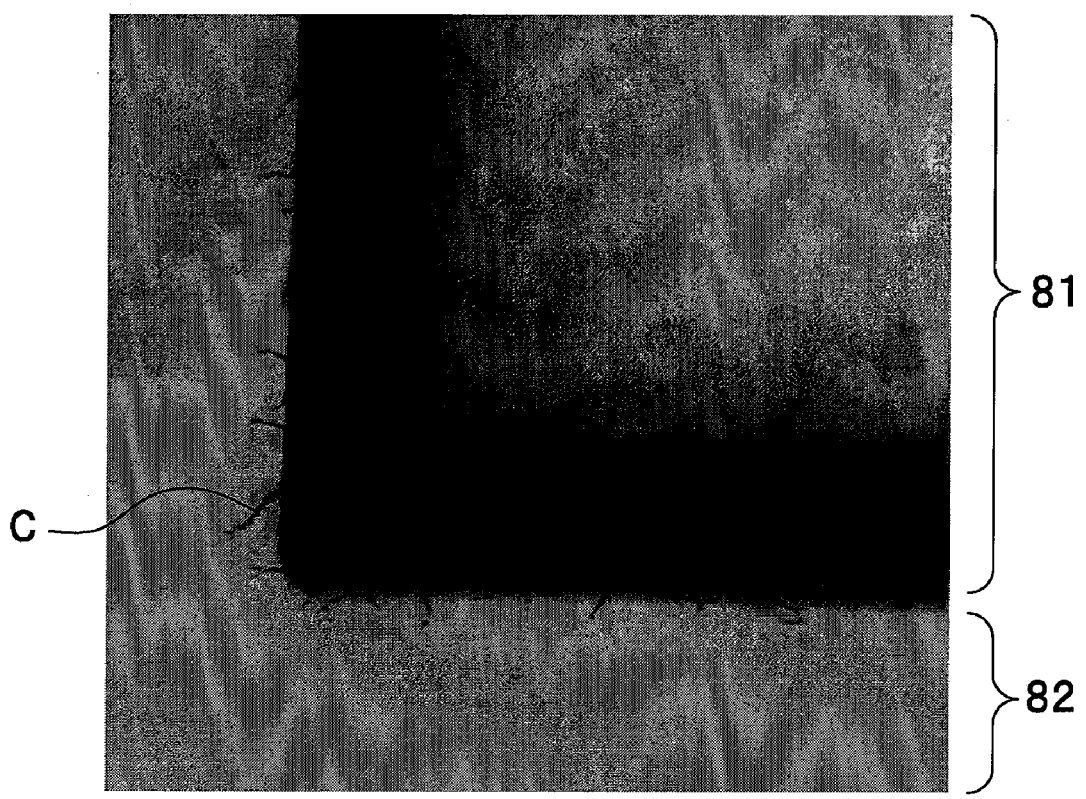
FIG. 11 is an optical micrograph of a semiconductor light emitting device which is fabricated without disposing a separation area between a second conductivity-type side electrode and an insulator film.

A semiconductor light emitting device which has no separation area between the second conductivity-type side electrode and the insulator film was fabricated as a comparative example, and inspected with an optical microscope. As shown in the micrograph of FIG. 11, cracks were observed on the insulator film 82 adjacent to the second conductivity-type side electrode 81. In contrast, in the semiconductor light emitting device according to the present invention, no cracks were observed on the insulator film which is separated from the second conductivity-type side electrode by the separation area.

What is claimed is:

1. A semiconductor light emitting device, comprising:
a semiconductor light emitting portion that includes,
a first conductivity-type semiconductor layer;
a second conductivity-type semiconductor layer; and
a light emitting layer which is disposed between the first conductivity-type semiconductor layer and the second conductivity-type semiconductor layer;
a first electrode connected to the first conductivity-type semiconductor layer; and
a second electrode directly connected to the second conductivity-type semiconductor layer; wherein,
the second electrode is separated from an insulator film covering the semiconductor light emitting portion by a separation area; and
a first portion of the insulator film is surrounded by the second electrode, with a first portion of the separation area arranged between the first portion of the insulator film and the second electrode.

2. The semiconductor light emitting device according to claim 1, wherein:
a continuous layer made of metal or alloy materials is disposed on outer sides of the second electrode and the insulator film; and
the separation area comprises one of a space, and a layer made of the metal or alloy materials that is disposed in the separation area.

3. The semiconductor light emitting device according to claim 1, wherein a substrate is disposed on the outer sides of the second electrode and the insulator film.

4. The semiconductor light emitting device according to claim 1, wherein:
the light emitting layer is disposed between the first electrode and the second electrode, the first electrode is disposed across the first conductivity-type semiconductor layer from the light emitting layer, and the second electrode is disposed across the second conductivity-type semiconductor layer from the light emitting layer; and
the first and second electrodes are alternately disposed in a plane view of the semiconductor light emitting portion.

5. The semiconductor light emitting device according to claim 1, wherein an area of the second electrode is larger than an area of the first electrode, in a plane view of the semiconductor light emitting portion.

6. The semiconductor light emitting device according to claim 1, wherein the second electrode is made of a light reflecting metal material.

7. The semiconductor light emitting device according to claim 6, wherein the light reflecting metal material is at least one selected from a group of Ag, Al, and Rh.

8. The semiconductor light emitting device according to claim 1, wherein an outer periphery of the second electrode is further surrounded by the insulator film, through another separation area.

9. A semiconductor light emitting device, comprising:
a semiconductor light emitting portion that includes,
a first conductivity-type semiconductor layer;
a second conductivity-type semiconductor layer;
a light emitting layer which is disposed between the first conductivity-type semiconductor layer and the second conductivity-type semiconductor layer;
a first electrode connected to the first conductivity-type semiconductor layer; and
a second electrode directly connected to the second conductivity-type semiconductor layer; wherein,
the second electrode is separated from an insulator film covering the semiconductor light emitting portion by a separation area;
a first portion of the insulator film is surrounded by the second electrode, with a first portion of the separation area arranged between the first portion of the insulator film and the second electrode;
an outer periphery of the second electrode is further surrounded by a second portion of the insulator film, with a second portion of the separation area arranged between the outer periphery of the second electrode and the second portion of the insulator film;
the semiconductor light emitting portion is disposed between the first and second electrodes;
the first electrode is disposed across the first conductivity-type semiconductor layer from the light emitting layer;
the second electrode is disposed across the second conductivity-type semiconductor layer from the light emitting layer; and
the first and second electrodes are alternately disposed, in a plane view of the semiconductor light emitting portion.

10. The semiconductor light emitting device according to claim 9, wherein an area of the second electrode is larger than an area of the first electrode, in the plane view of the semiconductor light emitting portion.

11. The semiconductor light emitting device according to claim 10, wherein:
the second electrode is made of a light reflecting metal material; and
the light reflecting metal material comprises at least one metal selected from the group consisting of Ag, Al, and Rh.

12. A semiconductor light emitting device, comprising:
a semiconductor light emitting portion that includes,
a first conductivity-type semiconductor layer;
a second conductivity-type semiconductor layer;
a light emitting layer which is disposed between the first conductivity-type semiconductor layer and the second conductivity-type semiconductor layer;
a first electrode connected to the first conductivity-type semiconductor layer; and a second electrode directly connected to the second conductivity-type semiconductor layer; wherein, the second electrode is separated from an insulator film covering the semiconductor light emitting portion by a separation area;

a first portion of the insulator film is surrounded by the second electrode, with a first portion of the separation area arranged between the first portion of the insulator film and the second electrode;

a continuous layer made of metal or alloy materials is disposed on outer sides of the second electrode and the insulator film;

the separation area comprises one of a space, and a layer made of the metal or alloy material that is disposed in the separation area;

a substrate is disposed on the outer sides of the second electrode and the insulator film;

the semiconductor light emitting portion is disposed between the first and second electrodes;

the first electrode is disposed across the first conductivity-type semiconductor layer from the light emitting layer;

the second electrode is disposed across the second conductivity-type semiconductor layer from the light emitting layer; and the first and second electrodes are alternately disposed, in a plane view of the semiconductor light emitting portion.

13. The semiconductor light emitting device according to claim 12, wherein an area of the second electrode is larger than an area of the first electrode, in the plane view of the semiconductor light emitting portion.

14. The semiconductor light emitting device according to claim 13, wherein:
  the second electrode is made of a light reflecting metal material; and
  the light reflecting metal material comprises at least one metal selected from the group consisting of AG, Al, and Rh.

15. The semiconductor light emitting device according to claim 14, wherein an outer periphery of the second electrode is further surrounded by a second portion of the insulator film, with a second portion of the separation area arranged between the outer periphery of the second electrode and the second portion of the insulator film.

16. The semiconductor light emitting device according to claim 12, wherein an outer periphery of the second electrode is further surrounded by a second portion of the insulator film, with a second portion of the separation area arranged between the outer periphery of the second electrode and the second portion of the insulator film.

17. The semiconductor light emitting device according to claim 16, wherein an area of the second electrode is larger than an area of the first electrode, in the plane view of the semiconductor light emitting portion.

* * * * *